United States Patent
Leininger et al.

(10) Patent No.: US 9,619,318 B2
(45) Date of Patent: Apr. 11, 2017

(54) MEMORY CIRCUITS, METHOD FOR ACCESSING A MEMORY AND METHOD FOR REPAIRING A MEMORY

(71) Applicants: Andreas Leininger, Munich (DE); Michael Richter, Munich (DE); Stefan Franz, Munich (DE)

(72) Inventors: Andreas Leininger, Munich (DE); Michael Richter, Munich (DE); Stefan Franz, Munich (DE)

(73) Assignee: INTEL DEUTSCHLAND GMBH, Neubiberg (DE)

( * ) Notice: Subject to any disclaimer, the term of this patent is extended or adjusted under 35 U.S.C. 154(b) by 9 days.

(21) Appl. No.: 13/773,832

(22) Filed: Feb. 22, 2013

(65) Prior Publication Data

US 2014/0245106 A1   Aug. 28, 2014

(51) Int. Cl.
*G11C 29/00*   (2006.01)
*G06F 11/10*   (2006.01)
(Continued)

(52) U.S. Cl.
CPC ...... *G06F 11/1008* (2013.01); *G06F 11/1016* (2013.01); *G11C 7/1006* (2013.01);
(Continued)

(58) Field of Classification Search
CPC .......................... G06F 11/1044; G06F 11/1008
(Continued)

(56) References Cited

U.S. PATENT DOCUMENTS 7,032,142 B2   4/2006  Fujioka et al.
7,681,109 B2 *  3/2010  Litsyn et al. ................ 714/773
(Continued)

FOREIGN PATENT DOCUMENTS

KR   1020030043658 A   6/2003
KR   10-2011-0050404 A   5/2011
(Continued)

OTHER PUBLICATIONS

Shah Jahinuzzaman et al. Multiword Based High Speed ECC Scheme for Lowvoltage Embedded SRAMs Department of Electrical & Computer Engineering University of Waterloo, Waterloo, ON, N2L 3G1, Canada 2008; pp. 226-229.
(Continued)

*Primary Examiner* — M. Mujtaba Chaudry

(57) ABSTRACT

A memory circuit is described comprising a plurality of memory elements, wherein each memory element is configured to store one data element of a plurality of data elements, an error correction information memory configured to store joint error correction information of the plurality of data elements, for each memory element, an error detection information memory storing error detection information for the data element stored in the memory element and a memory access circuit configured to, for an access to a memory element of the plurality of memory elements, check whether the error detection information for the data element stored in the memory element indicates an error of the data element stored in the memory element and, depending on whether the error detection information for the data element stored in the memory element indicates an error of the data element stored in the memory element, to process the error correction information for the access.

10 Claims, 16 Drawing Sheets

(51) Int. Cl.
*G11C 7/10* (2006.01)
*G11C 29/42* (2006.01)
*H03M 13/29* (2006.01)
*H03M 13/09* (2006.01)
*H03M 13/15* (2006.01)

(52) U.S. Cl.
CPC ......... *G11C 29/42* (2013.01); *H03M 13/2906* (2013.01); *H03M 13/09* (2013.01); *H03M 13/152* (2013.01)

(58) Field of Classification Search
USPC .................................................. 714/763, 801
See application file for complete search history.

(56) References Cited

U.S. PATENT DOCUMENTS

| | | | |
|---|---|---|---|
| 8,560,927 B1* | 10/2013 | Pagiamtzis | H03M 13/00 714/704 |
| 8,650,463 B2 | 2/2014 | Lim et al. | |
| 8,762,818 B1* | 6/2014 | Sun | H03M 13/1525 714/781 |
| 2003/0012372 A1* | 1/2003 | Cheng | H03M 13/2957 380/28 |
| 2003/0106010 A1 | 6/2003 | Fujioka et al. | |
| 2005/0229089 A1* | 10/2005 | Oza | H03M 13/2906 714/801 |
| 2006/0168494 A1* | 7/2006 | Trainin | 714/758 |
| 2009/0070657 A1* | 3/2009 | Litsyn | G06F 11/1072 714/773 |
| 2009/0113272 A1* | 4/2009 | Tan et al. | 714/765 |
| 2009/0276680 A1* | 11/2009 | Chiu | 714/752 |
| 2011/0004812 A1* | 1/2011 | Yang | 714/782 |
| 2011/0191649 A1 | 8/2011 | Lim et al. | |
| 2011/0191652 A1* | 8/2011 | Dave et al. | 714/758 |
| 2011/0280068 A1* | 11/2011 | Patapoutian | G11C 11/5628 365/185.03 |
| 2012/0084622 A1* | 4/2012 | D'Abreu et al. | 714/755 |
| 2012/0246507 A1* | 9/2012 | Luo | G06F 11/1048 714/2 |

FOREIGN PATENT DOCUMENTS

| | | |
|---|---|---|
| KR | 10-2011-0089728 A | 8/2011 |
| KR | 1020110090949 A | 8/2011 |
| WO | 2006078418 A2 | 7/2006 |
| WO | 2009140700 A1 | 11/2009 |
| WO | 2010062655 A2 | 6/2010 |

OTHER PUBLICATIONS

Volker Schoeber Memory Built-In Self-Repair using redundant words (2001) Infineon Technologies AG Balanstr. 73, 81 541 Munich, Germany pp. 995-1001.

M. Y. Hsiao A Class of Optimal Minimum Odd-weight-column SEC-DED Codes Proc. IBM Journal of Research and Development, vol. 14, Issue 4, pp. 395-401 Jul. 1970.

Shah M. Jahinuzzaman et al. Design and Analysis of a 5.3-pJ 64-kb Gated Ground SRAM With Multiword ECC IEEE Journal of Solid-State Circuits, vol. 44, No. 9, September 2009; pp. 2543-2553.

Michael Nicolaidis et al. Memory Defect Tolerance Architectures for Nanotechnologies Journal of Electronic Testing Theory and Applications 21; 2005; pp. 445-455.

Office Action issued in the corresponding Korean application No. 10-2014-0019089 dated Dec. 27, 2014 with English translation, 7 pages.

European Search Report in the EP application 14 15 2428.0 (6 pages), dated Dec. 17, 2014.

* cited by examiner

MEMORY CIRCUITS, METHOD FOR ACCESSING A MEMORY AND METHOD FOR REPAIRING A MEMORY

TECHNICAL FIELD

The present disclosure relates to memory circuits, methods for accessing a memory and methods for repairing a memory.

BACKGROUND

A data word stored in a memory element of a memory of an electronic data processing device may be corrupted, e.g. due to aging effects and thus deterioration of the memory element's reliability or, in case of a small features size, due to cosmic radiation. A memory element may even have, e.g. due to aging, a permanent error and may thus permanently produce corrupted data words. Since corrupt data words may lead to malfunctioning of electronic devices, e.g. crashes or, in case of a mobile phone, lost connections, reducing the risk of data errors or timely detection and/or correction of data errors is desirable. In view of the application in mobile devices, it is further desirable to do this at low computational complexity and with low power consumption.

SUMMARY

A memory is provided including a plurality of memory elements, wherein each memory element is configured to store one data element of a plurality of data elements, an error correction information memory configured to store joint error correction information of the plurality of data elements, for each memory element, an error detection information memory storing error detection information for the data element stored in the memory element and a memory access circuit configured to, for an access to a memory element of the plurality of memory elements, check whether the error detection information for the data element stored in the memory element indicates an error of the data element stored in the memory element and, depending on whether the error detection information for the data element stored in the memory element indicates an error of the data element stored in the memory element, to process the error correction information for the access.

Further, a memory circuit is provided including a plurality of memory elements, wherein each memory element is configured to store one data element of a plurality of data elements, an error detection information memory storing error detection information for the data element stored in a first memory element of the plurality of memory elements and a repair circuit configured to check whether the error detection information for the data element stored in the first memory element indicates an error of the data element stored in the first memory element and, depending on whether the error detection information for the data element stored in the first memory element indicates an error of the data element stored in the first memory element store repair information indicating that instead of the first memory element a second memory element of the plurality of memory elements should be used.

Further, a method for accessing a memory and a method for repairing a memory according to the above memory circuits are provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

The following detailed description refers to the accompanying drawings that show, by way of illustration, specific details and aspects of this disclosure in which the invention may be practiced. These aspects of this disclosure are described in sufficient detail to enable those skilled in the art to practice the invention. Other aspects of this disclosure may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

During product live time the storage elements (cells) of embedded memories are showing different aging behavior. This may result in a deterioration of the memory's reliability over its lifetime. In the worst case, some elements could even start to malfunction. Additionally, the risk of bit failures caused by cosmic radiation increases with the continued shrinking of the feature size.

For example, there may occur so called memory outlier bits during the aging of a product. Very rarely, individual bits in a memory will show an increased Vddmin drift. This is illustrated in FIG. 1.

Figure 1:
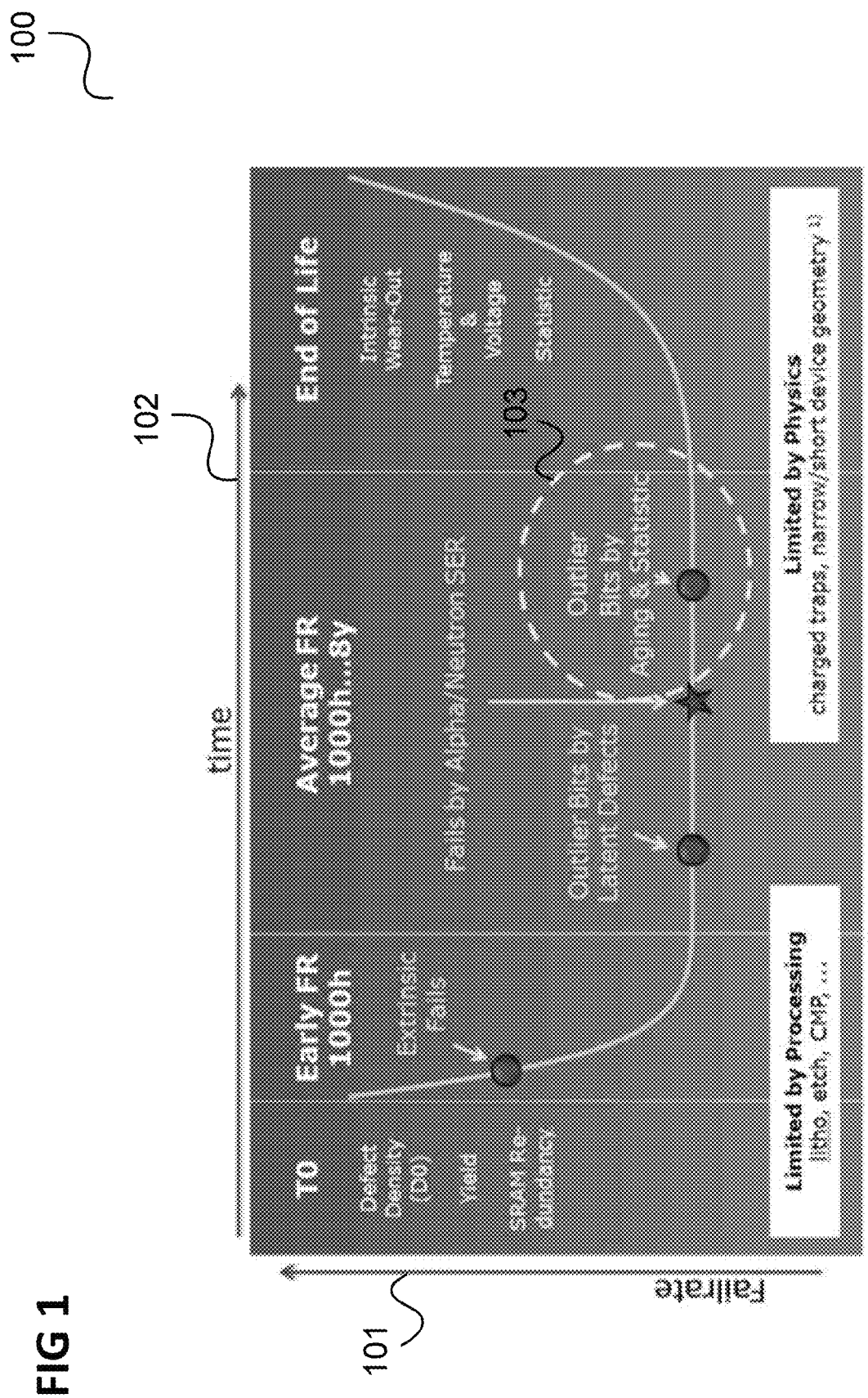
FIG. 1 shows a fail rate diagram.

FIG. 1 shows a fail rate diagram 100.

The fail rate diagram 100 illustrates the fail rate (increasing from bottom to top along a fail rate axis 101) of memory cells over the life time (increasing from left to right along a time axis 102) of a memory.

The occurrence of the memory outlier bits (marked by a circle 103) can partly be explained by NBTI (Negative bias temperature instability). NBTI can be seen as a key reliability issue in MOSFETs. It is typically of immediate concern in p-channel MOS devices, since they almost always operate with negative gate-to-source voltage. However, the very same mechanism may also affect n-channel MOS transistors when biased in the accumulation regime, i.e. with a negative bias applied to the gate. NBTI manifests itself as an increase in the threshold voltage of the MOSFET and consequently as a decrease in drain current and transconductance of the MOSFET. The degradation exhibits logarithmic dependence on time. It should be noted that the probability of memory outlier bits increases as the process size gets smaller. In particular for a 28 nm or smaller process the failures due to memory outlier bits pose a challenge to chip manufacturers.

The problem of failing memory cells in a memory may be addressed with various approaches:

a) Supply redundant information by use of error control coding (ECC). This may however introduce significant area and power consumption overhead since error correction bits are added (typically per data word)
  16 bit data words: 5 additional bits per data word->31% overhead
  32 bit data words: 6 additional bits per data word->19% overhead
  64 bit data words: 7 additional bits per data word->11% overhead
  This example is for an error correction code that allows correction of a failure in one bit.
  In addition, the logic (circuitry) to generate the ECB information (i.e. the error correction bits) and to decode the desired information (i.e. data) bits further increases the gate count and leads to an increased power consumption. Finally, real time decoding of the parity information (i.e. the error correction bits) introduces higher access delays of the memories, generating wait cycles likely.

b) Include built-in repair circuitry to test and calculate how to repair the memory using spare cells during boot-up. This may introduce a relatively long start-up delay before the device containing the memory can start its operation. Moreover, the environment conditions during system start-up can be different to the conditions experienced during normal operation, e.g. due to thermal heating.

c) Calculate for a number of values to be stored (e.g. a word) a parity bit which allows deciding during a subsequent read operation whether the stored values are correct. If the stored values are not correct this may be flagged, e.g. to the system using the memory. Important information may be lost or for a stable defective cell the system may always be intercepted at the same point of a program execution.

d) Calculate error correction bits (i.e. ECC information) over multiple (data) words instead of over individual words in order to decrease the area overhead. However, when writing or reading an individual word, multiple other words may need to be read as well, which increases the power consumption of the memory access, the required chip area of the memory and the access delay.

For many systems memory corruption cannot be tolerated as it leads to misbehavior of the entire system. In a mobile phone, for example, if individual bits of certain on chip memories are corrupted proper functionality of the mobile phone cannot be guaranteed. In this case the state of the device might be undefined or if this happens during a call a call drop might be the consequence.

Figure 2:
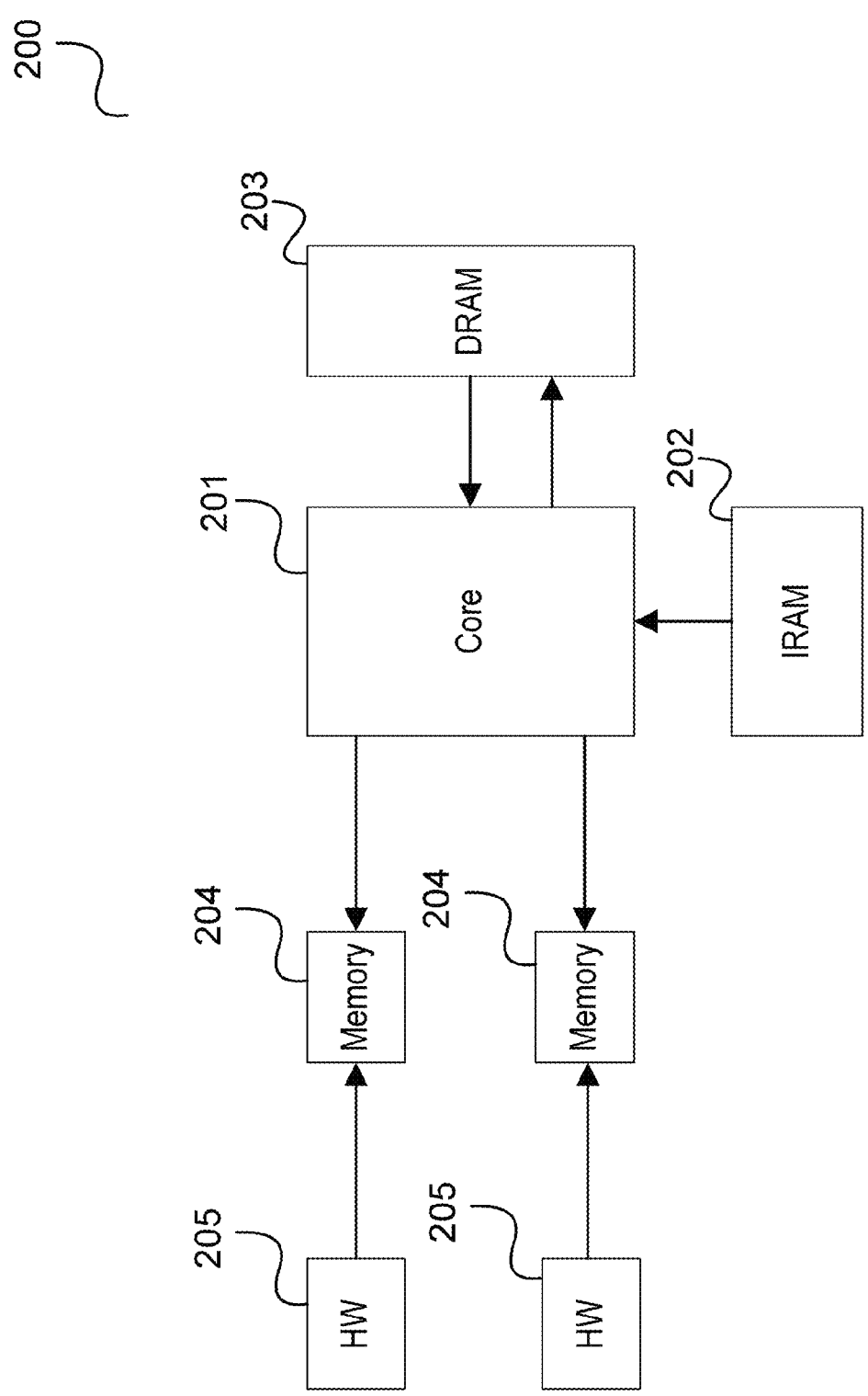
FIG. 2 shows a data processing system.

A simplified system architecture of a mobile phone is illustrated in FIG. 2.

FIG. 2 shows a data processing system 200.

The data processing system 200, e.g. of a mobile phone, includes a core 201 (or a plurality of cores, e.g. one or more controller and/or DSP cores) which is connected to an instruction RAM (Random Access Memory) 202 and a data RAM 203 and may have access to one or more memories 204 which are written by HW accelerators 205. The core 201 may further be connected to a cache memory (not shown).

For mobile phones (and generally mobile electronic devices) it is typically important to keep power consumption as low as possible. In the following, a memory circuit is described that may be used for error correction while introducing little overhead in terms of power consumption to memory accesses.

Figure 3:
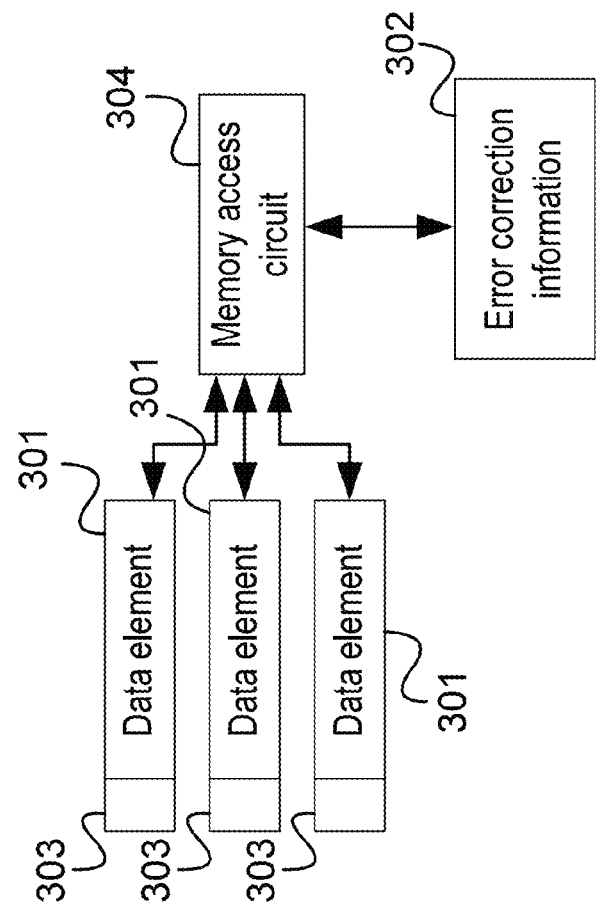
FIG. 3 shows a memory circuit configured to use joint error correction information which is processed depending on the error detection information.

FIG. 3 shows a memory circuit 300.

The memory circuit 300 includes a plurality of memory elements 301, wherein each memory element 301 is configured to store one data element of a plurality of data elements.

The memory circuit 300 further includes an error correction information memory 302 configured to store joint error correction information of the plurality of data elements and, for each memory element 301, an error detection information memory 303 storing error detection information for the data element stored in the memory element 301.

The memory circuit 300 further includes a memory access circuit 304 configured to, for an access to a memory element 301 of the plurality of memory elements 301, check whether the error detection information for the data element stored in the memory element 301 indicates an error of the data element stored in the memory element 301 and, depending on whether the error detection information for the data element stored in the memory element 301 indicates an error of the data element stored in the memory element 301, to process the error correction information for the access.

In other words, it is detected based on individual error detection information (i.e. information per data element, e.g. per data word) whether there is an error in the data word and depending on whether an error is detected, e.g. only if an error is detected the joint (i.e. common or shared) error correction information for the plurality of data elements is processed (e.g. an error correction is carried out).

Joint error correction information for a plurality of data elements may be understood as error correction information which needs all of the data elements for correcting an error in any of the data elements. In other words, for example, a subset of the error correction information is not sufficient to correct an error in a subset (e.g. one) of the data elements.

The access is for example a read access and the memory access circuit is for example configured to process the error correction information for the access if the error detection information for the data element stored in the memory element indicates an error of the data element stored in the memory element.

In case the access is a read access the memory access circuit is for example configured to omit processing the error correction information for the access if the error detection information for the data element stored in the memory element does not indicate an error of the data element stored in the memory element.

The access may also be a write access and the memory access circuit may be configured to process the error correction information for the access if the error detection information for the data element stored in the memory element does not indicate an error of the data element stored in the memory element.

In case the access is a write access the memory access circuit may be configured to omit processing the error correction information for the access if the error detection information for the data element stored in the memory element indicates an error of the data element stored in the memory element.

The error detection information is for example independent from data elements stored in other memory elements of the plurality of memory elements.

For example, the error detection information is one or more parity bits.

The error correction information may be dependent on all data elements of the plurality of data elements.

In case the access is a read access processing the error correction information for example includes correcting the error in the data element.

The memory access circuit may for example be configured, depending on whether the error detection information for the data element stored in the memory element indicates an error of the data element stored in the memory element, to process the other data elements of the plurality of data elements for the access.

For example, the memory access circuit is configured to process the other data elements for the access if the error detection information for the data element stored in the memory element indicates an error of the data element stored in the memory element.

The memory access circuit may for example be configured to omit processing the other data elements for the access if the error detection information for the data element stored in the memory element does not indicate an error of the data element stored in the memory element.

The access is for example a read access and processing the error correction information for example includes correcting the error in the data element based on the error correction information and the other data elements.

For example, processing the error correction information further includes storing the corrected data element in the memory element. Alternatively, the data element is corrected but is not written back to the memory element, e.g. assuming that there is a permanent error in the memory element.

The access is for example a write access and processing the error correction information for example includes determining new error correction information based on the error correction information and a data element to be written to the memory element in the write access and the data element stored in the memory element.

Figure 4:
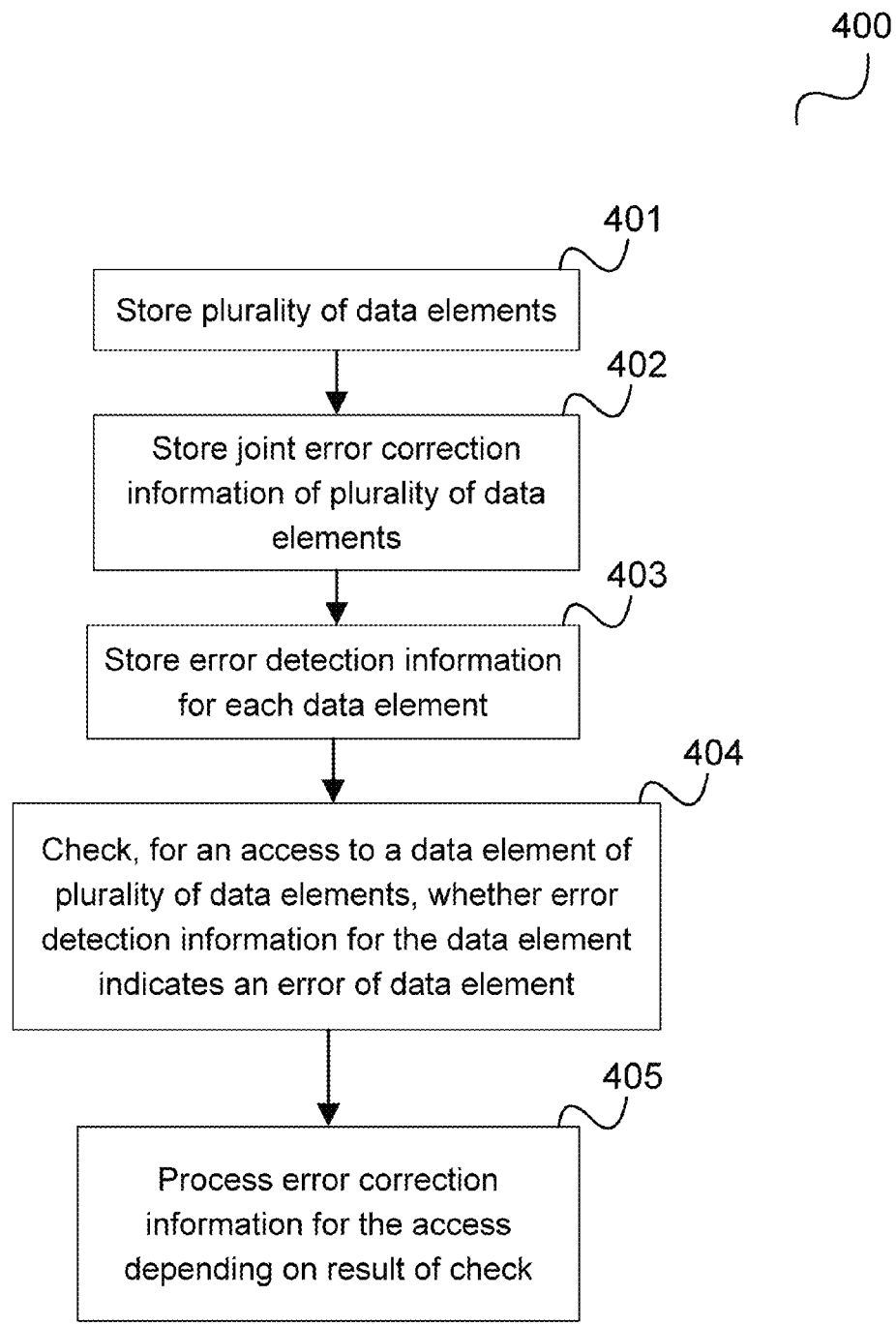
FIG. 4 shows a flow diagram illustrating a method for accessing a memory.

The memory circuit 300 for example carries out a method as illustrated in FIG. 4.

FIG. 4 shows a flow diagram 400.

The flow diagram 400 illustrates a method for accessing a memory, for example carried out by a memory circuit.

In 401, the memory circuit stores a plurality of data elements.

In 402, the memory circuit stores joint error correction information of the plurality of data elements.

In 403, the memory circuit stores error detection information for each data element.

In 404, the memory circuit checks, for an access to a data element of the plurality of data elements, whether the error detection information for the data element indicates an error of the data element.

In 405, the memory circuit processes the error correction information for the access depending on whether the error detection information for the data element indicates an error of the data element.

It should be noted that the plurality of data elements may be stored successively. For example, 401, 402, 403 may be carried out for storing each of the plurality of data elements.

In the following, a memory circuit is described that allows handling permanent errors in a memory cell, e.g. due to the memory cell being permanently broken.

Figure 5:
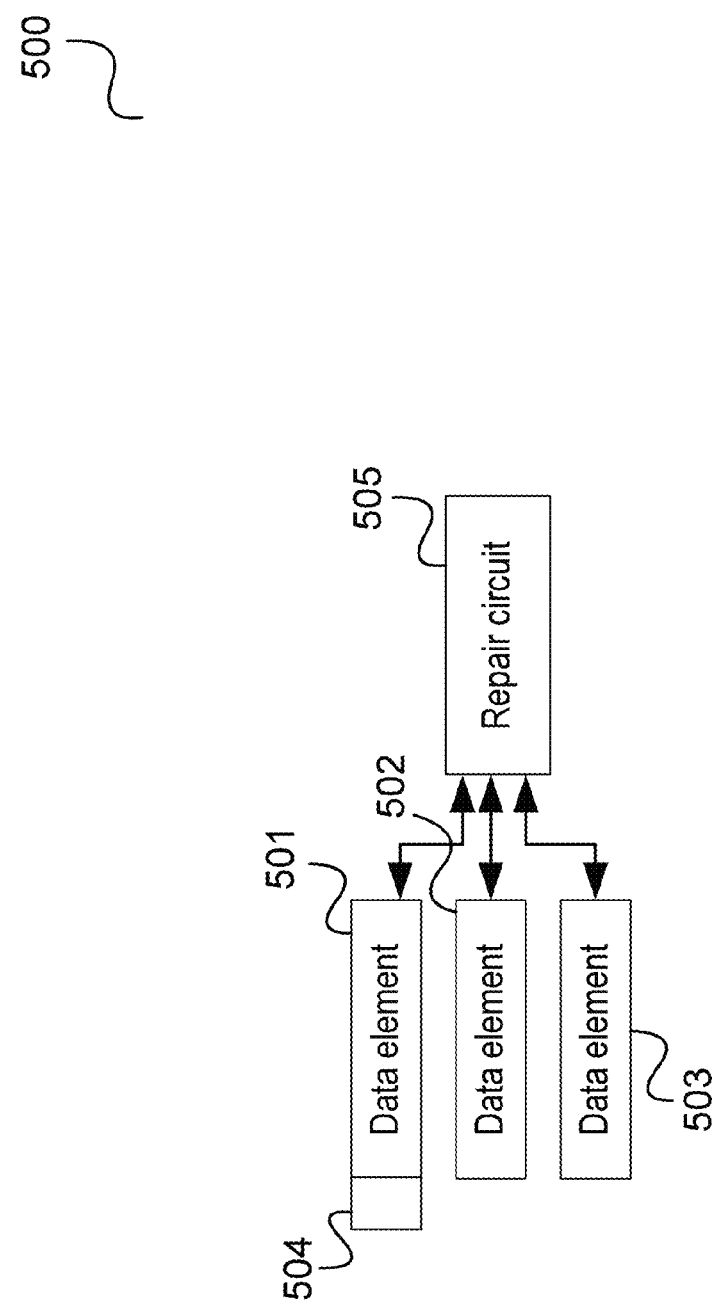
FIG. 5 shows a memory circuit configured to repair a memory based on error detection information.

FIG. 5 shows a memory circuit 500

The memory circuit 500 includes a plurality of memory elements 501, 502, 503 wherein each memory element 501, 502, 503 is configured to store one data element of a plurality of data elements and an error detection information memory 504 storing error detection information for the data element stored in a first memory element 501 of the plurality of memory elements 501, 502, 503.

A repair circuit 505 configured to check whether the error detection information for the data element stored in the first memory element 501 indicates an error of the data element stored in the first memory element 501 and, depending on whether the error detection information for the data element stored in the first memory element 501 indicates an error of the data element stored in the first memory element 501 store repair information indicating that instead of the first memory element 501 a second memory element 502 of the plurality of memory elements 501, 502, 503 should be used.

The operation of the repair circuit may for example be carried out during normal operation of the device containing the memory circuit, e.g. after starting usage of the device by the end user instead of, for example as part of a test procedure before shipping.

In other words, when an error in a data element stored in a memory element is detected (e.g. in case that an error in a data element stored in this memory element has already been detected for a predetermined number of times) the memory is repaired in the sense that the address of the memory element is mapped to another (operational) memory element such that subsequent accesses to the memory element are redirected to the other memory element. Thus, usage of a memory element which has produced an error (or for example has produced errors for a predetermined number of times), e.g. due to the fact that the memory element is broken, can be avoided. The error is detected based on error detection information, which may for example be one or more parity bits or ECC information and thus may be joint error detection information for a plurality of data elements (e.g. joint error correction information, e.g. ECC information) or individual error detection information for the data element.

For example, to ensure proper functionality it may not be possible to tolerate permanent errors of the memories of the data processing system 200, i.e. IRAM 202, Data RAM 203 and memories 204. For example, proper functionality of the IRAM 202 is ensured, while keeping the overhead low, by placing redundant memory elements on the chip and adding a system repair block which can replace defect memory cells by the redundant memory elements during normal operation of the device containing the data processing system and not only during a test phase (e.g. in course of manufacturing, e.g. before shipping the device to customers). For the IRAM 1402 an error detection and/or correction scheme is for example used allowing detection and/or correction of errors in bursts of data words (i.e. groups of data words) through error control bits (ECBs). This may be combined with a flexible way of scheduling the error detection/correction block such that the additional required power can be kept negligibly small.

It should be noted that also the memory elements 502, 503 may be provided with an error detection information memory like the error detection information memory 504.

The repair circuit may for example be configured to store the repair information if the error detection information for the data element stored in the first memory element indicates an error of the data element stored in the first memory element.

The memory circuit may further include a determiner configured to determine a number of occurrences that error detection information for a data element stored in the first memory element has indicated an error of the data element stored in the first memory element and the repair circuit may be configured to store the repair information if the number of occurrences has exceeded a predetermined threshold (e.g. overall, or since a certain event), e.g. if the most recent indication of an error leads to the number occurrences to exceed the predetermined threshold.

The memory circuit may further include a memory access circuit configured to check, for a memory element to be accessed, whether repair information is stored indicating that instead of the memory element another memory element of the plurality of memory elements should be used and, depending on the result of the check access the memory element or the other memory element.

The repair circuit is for example configured to store the repair information in non-volatile memory, e.g. in addition to initially storing it in a volatile memory. For example, the repair circuit stores the repair information in a non-volatile memory upon system shut down. The repair circuit or another component of the memory circuit may, e.g. upon system reboot, read the repair information from the non-volatile memory.

For example, the memory elements are part of a chip and the non-volatile memory is external to the chip.

The repair circuit may further be configured, if the error detection information for the data element stored in the first memory element indicates an error of the data element, to correct the data element stored in the first memory and to store the corrected data element in the second memory element.

Figure 6:
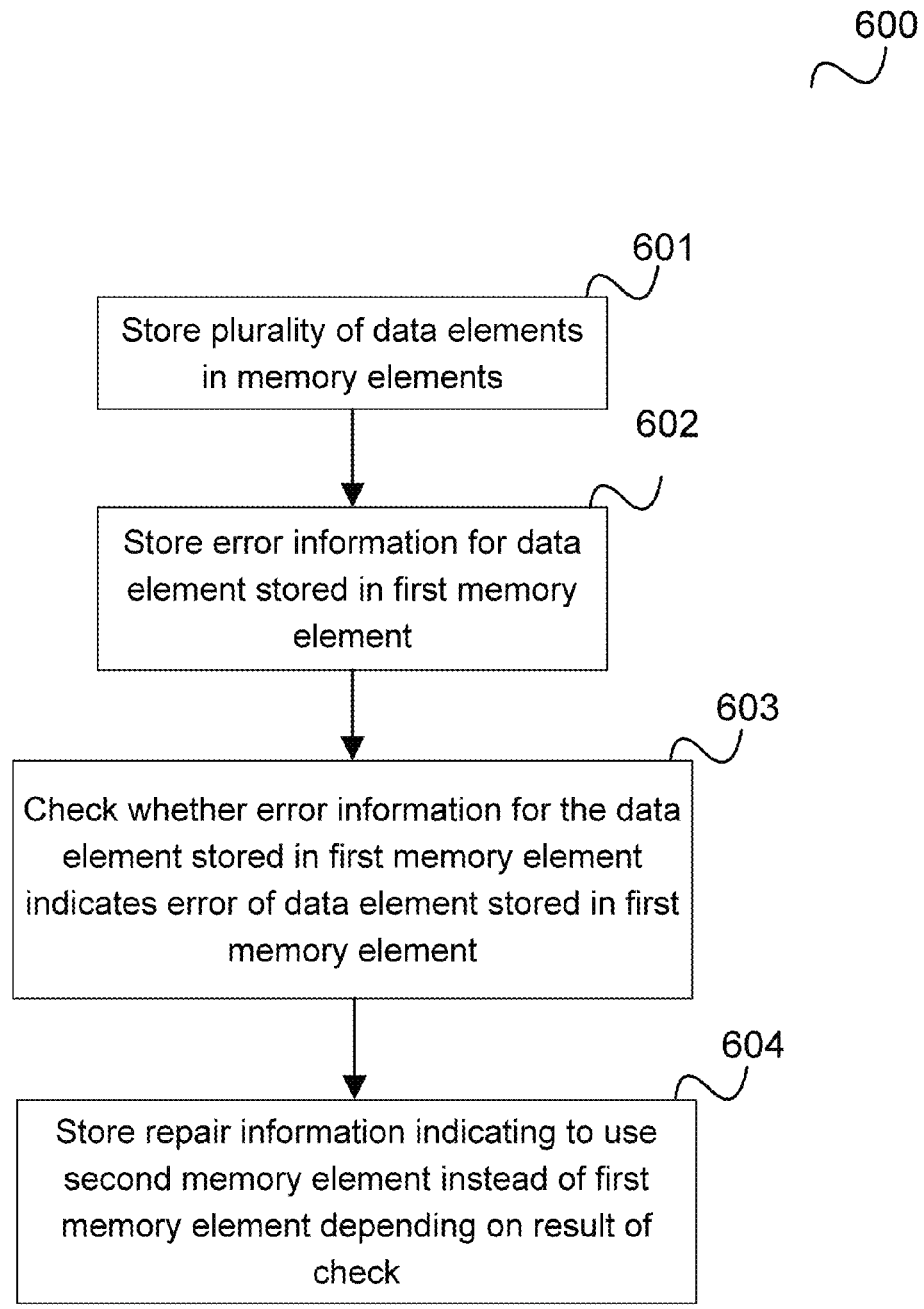
FIG. 6 shows a flow diagram illustrating a method for repairing a memory.

The memory circuit 500 for example carries out a method as illustrated in FIG. 6.

FIG. 6 shows a flow diagram 600.

The flow diagram 600 illustrates a method for repairing a memory, for example carried out by a memory circuit including a repair circuit.

In 601, the memory circuit stores a plurality of data elements in a plurality of memory elements.

In 602, the memory circuit stores error detection information for the data element stored in a first memory element of the plurality of memory elements.

In 603, the memory circuit checks whether the error detection information for the data element stored in the first memory element indicates an error of the data element stored in the first memory element.

In 604, the memory circuit stores repair information indicating that instead of the first memory element a second memory element of the plurality of memory elements should be used (e.g. for subsequent accesses) depending on whether the error detection information for the data element stored in the first memory element indicates an error of the data element stored in the first memory element.

601 to 604 are for example carried out during normal operation of the device containing the memory circuit, e.g. after starting usage of the device by the end user instead of, for example as part of a test procedure before shipping.

It should be noted that aspects an examples described in context of one of the memory circuits are analogously valid for the other memory circuit and the methods illustrated in FIGS. 4 and 6 and vice versa. For example, among others, the functionalities and features described for the memory circuit 500 may be combined with the functionalities and features described for the memory circuit 300.

The components of the memory circuit (e.g. the oscillator, the accuracy determiner, the signal detector, the controller) may for example be implemented by one or more circuits. A "circuit" may be understood as any kind of a logic implementing entity, which may be special purpose circuitry or a processor executing software stored in a memory, firmware, or any combination thereof. Thus a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit".

A memory may for example be an SRAM (Static Random Access Memory). It should be noted that "memory" may refer to one or more memory cells of a large memory, i.e. the various memories (e.g. the memory elements, the error detection information memory and the error correction information memory) are not necessarily separate memories. For example, the error detection memories 303 may be part of a larger memory, e.g. the memory containing the memory elements 301.

In the following, examples are described in more detail.

In the following, an example is given in which the low power of word-wise ECC with the lower error correction bit overhead of multi-word ECCs can be seen to be combined. This can be seen as an example of the memory circuit 300 and the method illustrated in figure and 4. The memory structure used in this example is illustrated in FIG. 7.

Figure 7:
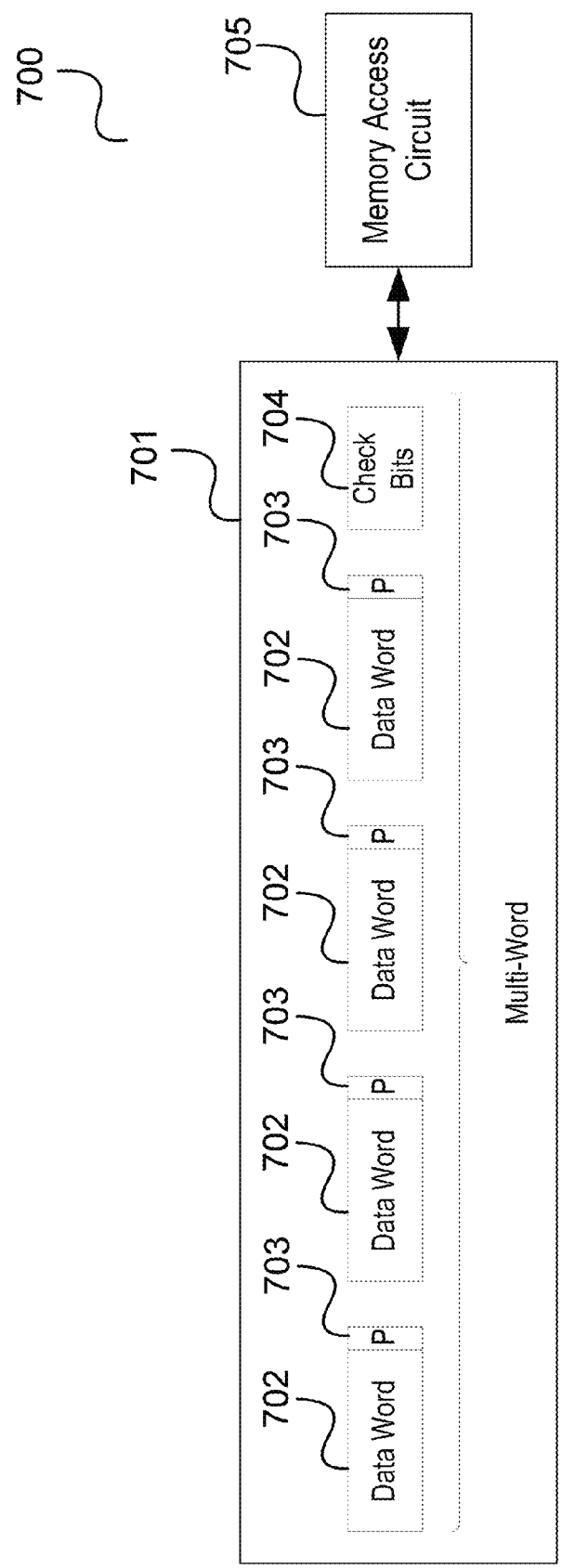
FIG. 7 shows a memory circuit illustrating the aggregation of data words to multi-words.

FIG. 7 shows a memory circuit 700.

The memory circuit 700 includes a memory 701 including a plurality of memory elements 702 wherein each memory element 702 is configured to store a data word (as example for a data element).

Further, for each memory element 702, the memory 700 includes a parity memory 703 storing a parity bit (as error detection information) for the data word stored in the memory element 702. Additionally, the memory includes an error correction bit memory 704 storing an error correcting codeword (including error correction bits also referred to as check bits) calculated over all the data words stored in the memory elements 702 (as error correction information). The memory circuit 700 includes a memory access circuit 705 which for example includes or operates as a ECC (error correcting circuit) which calculates the error correction bits of an error correcting code without using the parity information stored in the parity memory (referred to as alternative 1 in the following) or using the parity information stored in the parity memory to reduce the ECC's error correction bit count (referred to as alternative 2 in the following).

The plurality of memory elements 702, the parity memories 703 and the code word memory are referred to as a multi-word. The memory 701 may include a multiplicity of such multi words.

The parity bit stored in the parity memory 703 for a memory element 702 of an address $a_x$ indicates whether the data word $w_{old, x}$ which has previously been stored at in the memory element 702 is still correct. If a new word $w_{new, x}$ is to be written to the memory element 702 and the old word $w_{old, x}$ is correct the new error correction bits for the new multi-word (now including the new word $w_{new, x}$ instead of the old word $w_{old, x}$) are calculated without reading out the remaining data words, i.e. the data words stored in the other memory elements 702. To calculate the new ECC code bits (i.e. the new error correction bits for the code word memory 704) only the difference between the old word $w_{old, x}$ and the new word $w_{new, x}$ is important.

In this way, a significant area reduction (e.g. 76%) compared to standard single-error-correcting (SEC) ECC, as well as a significant write power reduction (88%) compared to multiple word SEC-ECC is achieved.

Additionally, the parity bit allows the memory access circuit 705 to decide quickly whether a data word needs to be corrected. For error-free data words, this reduces memory access time and power consumption (as the ECC error correction bits do not have to be evaluated). Further, the grouping of the plurality of memory elements (and correspondingly the data words) to form a multi-word and joint ECC error correction bits reduces the error correction bit overhead.
  a. ECC overhead for 32 data bit (SEC): 6 check bits->19% overhead
  b. ECC overhead combining 16×32 data bit=512 data bit: 10 check bit→2% overhead
    i. Alternative 1: 16 additional parity bits plus 10 check bits=26 bit→5.1% overhead
    ii. Alternative 2 with reduced overhead: 16 parity bit+6 ECC bit=22 bit→4.2% overhead
  c. Power reduction compared to standard multiple word ECC solution (assuming error-free data):
    i. Read access: (16 read+1 ECC information read) to (1 data read+reading parity bit)
    ii. Write access: (Read 15 data words and write 1 data word and 1 ECC information) to (Read and write 1 data+ECC information)

The memory access circuit 705 may for example use the linearity property of the ECC and may calculate the ECC error correction bits calculated based only on the difference of the old and the new data word. For error-free words—which can in practical application be expected to be the vast majority—this reduces the number of bits that need to be read and processed.

This reduction can be seen enabled by adding a parity bit per data word since the parity bit allows detecting errors of the data words and ensuring (up to a certain likelihood) that the data word that is altered does not have any error. By using the linearity property, the memory access circuit 703 calculates the ECC control bits for the plurality of data words of a multi-word, hereby reducing the area overhead for ECC significantly compared to individual ECC error correction bits for each data word. For a higher number of data words the above approach allows a practically usable implementation of multi-word ECC error correction bits (i.e. usage of joint error correction bits for a plurality of data words) in terms of power consumption and access times.

The joint check bits protect the multi-word by ECC such that for example any single bit error within the multi-word can be corrected. Each individual data word within a multi-word is protected by its own parity bit.

When an individual data word is to be read out from a memory element 702, the memory access circuit 705 ensures data integrity by checking for errors and, if necessary, error correction. Reading out a data word and its associated parity bit suffices for checking the data word for single bit errors.

In the normal case (without error), the evaluation of the parity bit shows no error and the data word may be directly forwarded to the output of the memory circuit 700 (e.g. output to a processor that has requested the data word). In the (typically unlikely) event of an error the full multi-word (i.e. all data words of the multi-word) are read out and error correction is performed.

Figure 8:
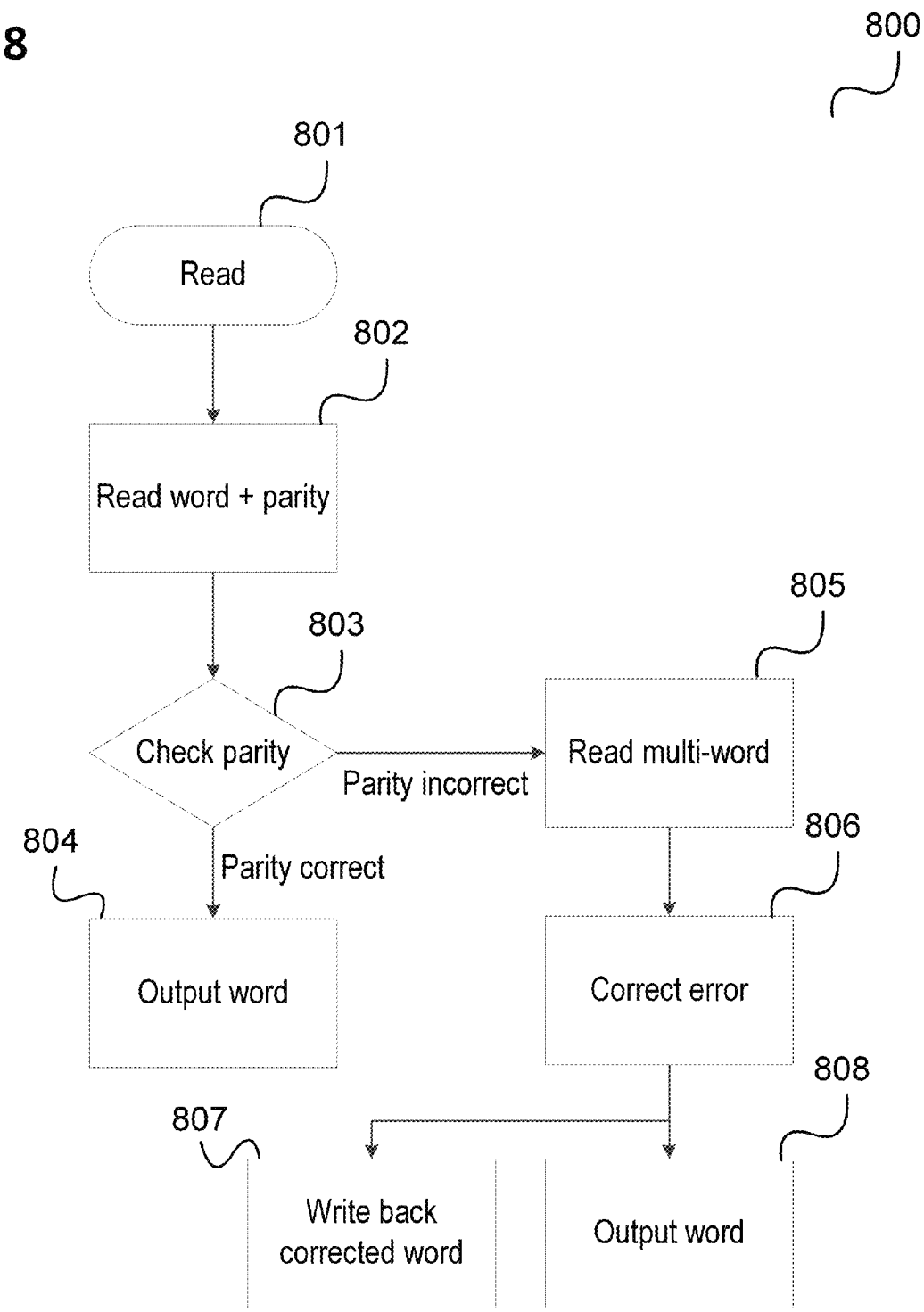
FIG. 8 shows a flow diagram illustrating a read access.

This process performed in case of a read access is illustrated in FIG. 8.

FIG. 8 shows a flow diagram 800.

In 801, the memory access circuit 705 receives a read request to a memory element 702, e.g. from a processor of a device containing the memory circuit 700.

In 802, the memory access circuit reads the data word from the memory element 702 and the parity bit from the associated parity memory 703.

In 803, the memory access circuit 705 checks whether the parity bit is correct for the data word.

In case the parity bit is correct, the memory access circuit 705 outputs the data word to the requesting entity, e.g. a processor, in 804.

In case the parity bit is incorrect, the memory access circuit 705 reads the data words from all memory elements 702 belonging to the multi-word, the error correction bits from the error correction bit memory 704 and, in case that the error correction bits have been calculated including the parity bits (i.e. in case of alternative 2), the parity bits from the parity bit memories 703 in 805.

In 806, the memory access circuit 705 corrects the error using the information read in 805.

The memory access circuit 705 then outputs the requested (corrected) data word in 808. Further, in 809, the memory access circuit 705 writes the corrected data word back to the memory element 702.

In practical application, it can be expected that in the vast majority of accesses—those with undisturbed data—only the individual data word and its parity bit have to be accessed and processed in case of a read access instead of a reading of a complete multi-word for each read access.

During a write access to a memory element 702, the memory access circuit 702 computes the error correction bits for the multi-word to which the memory element 702 belongs. The updated error correction bits depend both on the value of the new data word that is written and on the values of the unmodified data words of the multi-word (i.e. the data words stored in the memory elements 702 of the multi-word that are not written).

The memory access circuit 705, instead of reading out the complete multi-word, updating the data word stored in the memory element 702 to which is written, computing the new error correction information (for the modified multi-word including the modified data word) and writing the complete multi-word back into memory, uses the fact that information about the unmodified data words of the multi-word are encoded into the error correction bits: If the data word to be updated is error-free, then the new error correction bits check_bits$_{new}$ are obtained from the old error correction bits check_bits$_{old}$ by: check_bits$_{new}$=check bits$_{old}$ $\oplus$ CBF(data_word$_{new}$ $\oplus$ data_word$_{old}$) wherein $\oplus$ denotes bit-wise exclusive or (i.e. binary addition) and CBF denotes the function to compute the error correction bit values (defined by the implemented error correction code) and wherein data_word$_{old}$ is the data word stored in the memory element 702 before the write access and data_word$_{new}$ is the data word that is written to the memory element 702.

Thus, only in case that the parity bit of the data word stored in the memory element 702 (to which is written) indicates an error, the process of reading out the whole multi-word, determining the check bits based on the whole multi-word and writing the determined check bits and the new data word is performed.

It should be noted that the data words and the error correction bits may initially be initialized such that the error correction bits are correct for the data words and can, starting from this initial state, be updated according to the above formula when new data words are written. The initial state may for example be a simple initial state that is correct according to the error correction code used, e.g. the data words and the error correction bits all being zero.

Figure 9:
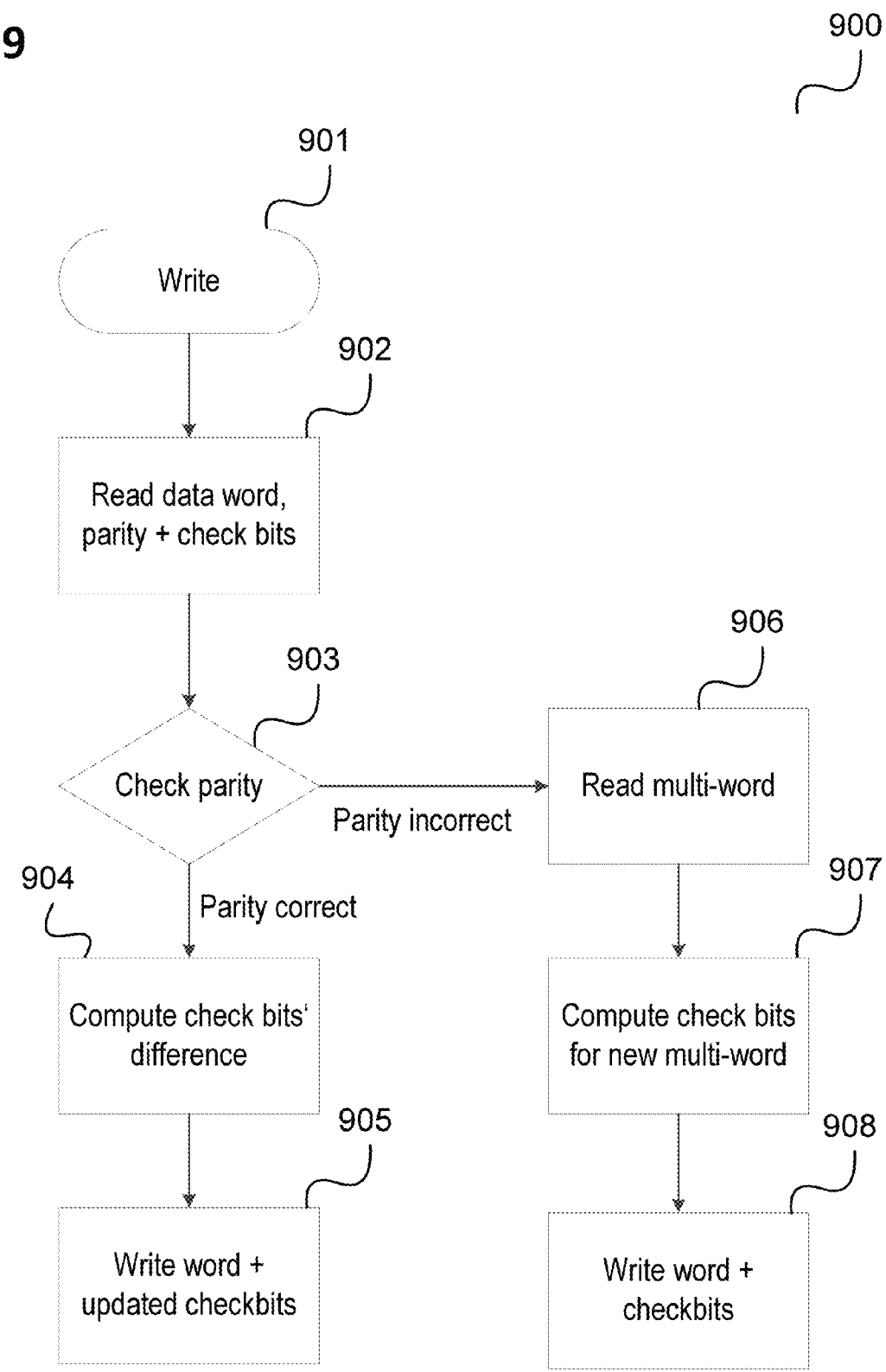
FIG. 9 shows a flow diagram illustrating a write access.

The process performed in case of a write access is illustrated in FIG. 9.

FIG. 9 shows a flow diagram 900.

In 901, the memory access circuit 705 receives a write request to a memory element 702, e.g. from a processor of a device containing the memory circuit 700, i.e. a request to write a new data word to the memory element 702.

In 902, the memory access circuit 705 reads the data word stored in the memory element 702, the parity bit stored in the parity memory 703 of the memory element 702 and the error correction bits stored in the error correction bit memory 704.

In 903, the memory access circuit 705 checks whether the parity bit is correct for the read data word (i.e. the old data word). In case the parity bit is correct, the memory access circuit 705 determines the new error correction bits according to the above formula in 704 and writes the new data word to the memory element 702 and the determined new error correction bits to the error correction bit memory 704 in 905.

In case the parity bit is not correct, i.e. indicates an error in the old data word, the memory access circuit 705 reads all data words of the multi-word in 906, determines the error correction bits based on all data words in 907 and writes the new data word to the memory element 702 and the determined new error correction bits to the error correction bit memory 704 in 908.

Figure 10:
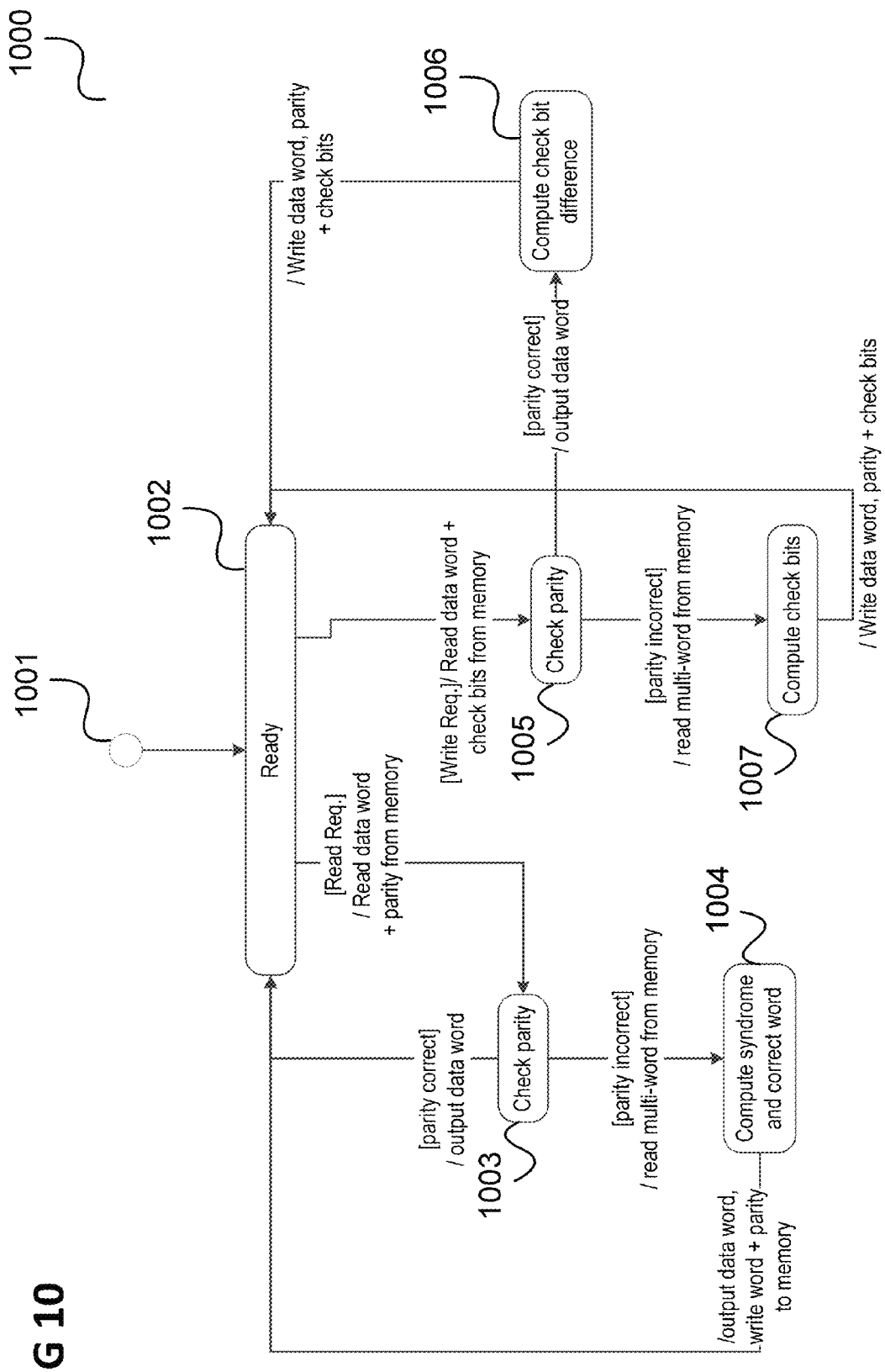
FIG. 10 shows a state diagram illustrating the behavior of the memory access circuit for read accesses and write accesses.

FIG. 10 shows a state diagram 1000 illustrating the behavior of the memory access circuit 705 for read accesses and write accesses.

From a start state 1001, the memory access circuit 705 enters a ready state 1002 in which it is ready to receive a request for a read access or a request for a write access.

In case of a read request to a memory element 702, the memory access circuit 705 reads the data word to be read and the associated parity bit and enters a first check parity state 1003 in which it checks whether the parity bit is correct for the read data word.

In case the parity bit is correct, it outputs the read data word and returns to 1002.

In case the parity bit is incorrect, it reads all data words of the multi-word and enters a compute syndrome and correct word state 1004 in which it determines corrects the data word to be read based on all data words of the multi-word. The memory access circuit 705 then outputs the corrected requested data word, writes the corrected data word back to the memory element 702 and the parity bit for the data word and returns to 1002.

In case of a write request to a memory element 702, the memory access circuit 705 reads the data word, the parity bit for the data word and the error correction bits and enters a second check parity state 1005 in which it checks whether read parity bit is correct for the read data word.

In case the parity bit is correct, the memory access circuit 705 enters a compute check bit difference state 1006 in which it determines the new error correction bits according to the above formula. It then writes the new data word, the parity bit for the new data word and the determined check bits and returns to 1002.

In case the parity bit is incorrect, the memory access circuit 705 reads all data words of the multi-word from the memory 701 and enters a compute check bits state 1007 in which it computes the error correction bits based on the read data words and the new data word. It then writes the new data word, the parity bit for the new data word and the determined check bits and returns to 1002.

Figure 11:
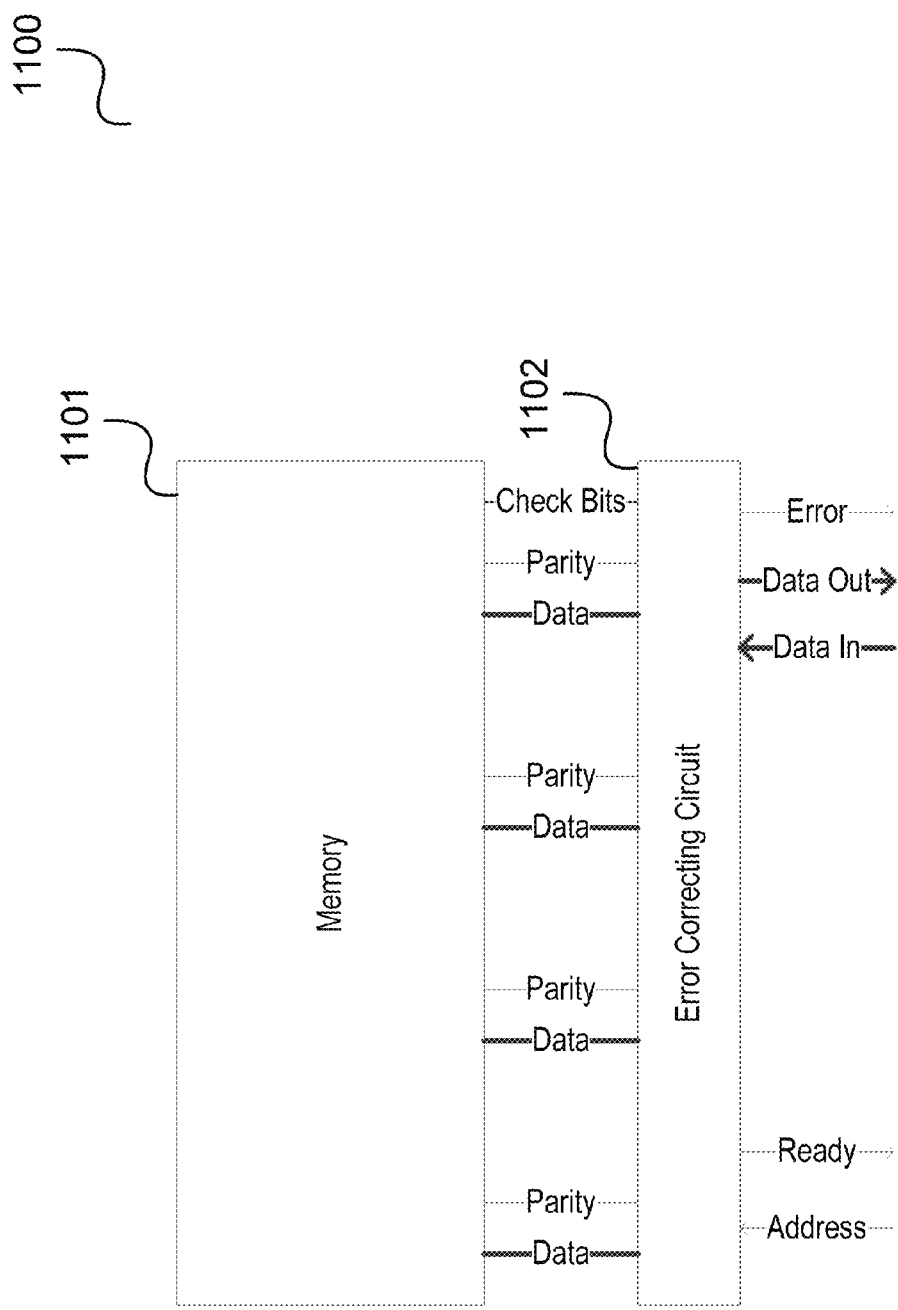
FIG. 11 shows a memory circuit illustrating signals for communication between memory and error correction circuit.

An example for the architecture and signals exchanged is given in FIG. 11.

FIG. 11 shows a memory circuit 1100.

The memory circuit 1100 includes a memory 1101, for example corresponding to the memory 701 and an error correction circuit 1102 corresponding to the memory access circuit 705.

The memory 1101 and the error correction circuit 1102 exchange data words read or written to memory elements 701 and corresponding parity bits. Further the memory 1101 and the error correction circuit 1102 exchange check bits (i.e. error correction bits). The error correction circuit 1102 receives an address for an access to the memory 1101, may (optionally) indicate that it is ready for a memory access (e.g. that it is in ready state 1002), may receive input data (e.g. a data word for a write access), output data (e.g. a data word to be read in a read access) and may (optionally) have an output for an error signal indicating an error state.

In the following, an example is described in which a memory (e.g. in a product such as a mobile phone) is repaired, e.g. during normal operation of the product. In the following example one parity bit is inserted per physical memory element to indicate a single or impair number of errors in the data word stored in this memory element. During system operation a defect memory element may thus be detected and automatically be repaired by hardware circuitry. This can be seen as an example for the memory circuit 500 and the method illustrated in FIG. 6.

Figure 12:
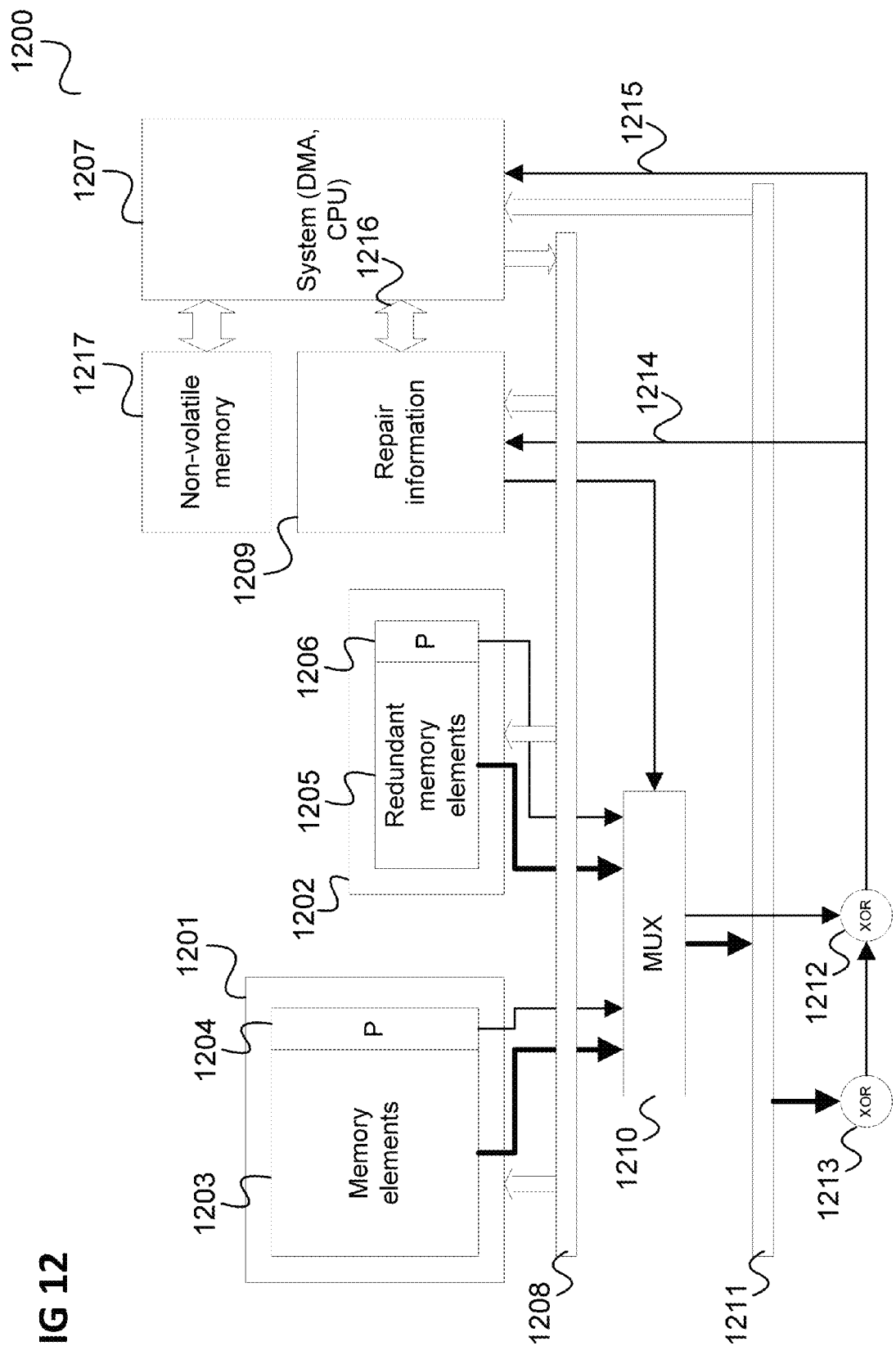
FIG. 12 shows a memory arrangement illustrating a memory repair mechanism based on error detection parity bits.

FIG. 12 shows a memory arrangement 1200.

The memory arrangement 1200 includes a first memory 1201 and a second memory 1202. The first memory 1201 includes a plurality of (data) memory elements 1203 and a first parity memory 1204 which includes, for each memory element 1203, a parity bit. The parity bit for a memory element 1203 may indicate that the data word stored in the memory element 1203 has an error and thus allows identifying corrupted memory elements 1203.

Similarly, the second memory 1202 includes a plurality of (data) memory elements 1205 and a second parity memory 1206 which includes, for each memory element 1205, a parity bit. In this example, a memory element 1203 which is found to be corrupted is replaced by a memory element 1205 of the second memory 1202 (e.g. on the fly during operation) by repair circuitry. The memory elements 1205 of the second memory 1202 can be seen as redundant memory elements.

A (computer) system component, e.g. a DMA (Direct Memory Access) circuit or a CPU (Central Processing Unit) may provide an address via an address bus 1208 for a read access to one of the memory elements 1203.

A repair information memory 1209 stores repair information which may indicate for one of the memory elements 1203 of the first memory 1201 that instead of the memory element 1203 one of the memory elements 1205 of the second memory 1202 should be used. Such an indication is stored in the repair information memory 1209 for a memory element 1203 of the first memory 1201 in case that the memory element 1203 has been found to be corrupted.

To illustrate, it is assumed that the system component 1207 requests a read access directed to a memory element 1203 which has not yet found to be corrupted.

Accordingly, the data word stored in the memory element 1203 and the parity bit for this memory element 1203 are supplied to a multiplexer 1210. Since the memory element 1203 has not yet been found to be corrupted, the repair information does not indicate for this memory element 1203 that one of the memory elements 1205 of the second memory 1202 should be used instead and outputs the read data word to a data bus 1211 and the read parity bit to a first XOR (exclusive or) gate 1212. Via the data bus 1211, the data word is supplied to a second XOR gate 1213 which determines the correct parity bit for the data word and supplies the result to the first XOR gate 1212 which serves as a comparator of the read parity bit and the parity bit determined by the second XOR gate 1213. The output of the first XOR gate 1212 thus indicates whether the read parity bit is correct for the data word read and thus indicates whether an error in the data word has been found. If the read parity bit is correct, the system component 1207 receives the read data word and the repair information is kept unchanged.

In case that the parity bit is incorrect this indicates that the data word has an error. Based on this, the accessed memory element of the memory elements 1203 may be found to be corrupted. For example, in case that an error for this memory element has been found more often than a predetermined number of times (e.g. as specified by a counter counting the number of occurrences of errors for this memory element 1203) the memory element is found to corrupted. Accordingly, repair information may be stored in the repair information memory 1209 that in future, instead of the memory element 1203 of the first memory 1201, a memory element 1205 of the second memory 1202 is to be used.

This may happen by means of a controller of the repair information memory 1209 (based on a direct signaling 1214 of the output of the first XOR gate 1212) or via the system component 1207 (e.g. via a signaling 1215 of the output of the first XOR gate 1212 to the system component 1207) which may have an interface 1216 to the repair information memory 1209.

The memory element 1205 of the second memory 1202 that is used as backup (in other words to repair) the memory element 1203 of the first memory 1201 that has been found to be corrupted is assigned the same address as the memory element 1203 of the first memory 1201 such that it reacts to future read accesses to the memory element 1203 of the first memory 1201.

In case of a future read access request by the system component 1207 both the memory element 1203 of the first memory 1201 and the memory element 1205 of the second memory supply the data words they store and the associated parity bits. Since the repair information now includes the information that the memory element 1205 of the second memory 1202 is to be used instead of the memory element 1203 of the first memory 1201, the multiplexer 1210 now forwards the data word stored in the memory element 1205 of the second memory 1202 and the associated parity bit.

Thus, in effect, the memory element 1203 of the first memory 1201 is no longer used.

A write access (not illustrated in FIG. 12) may be done analogously wherein, when a data word is stored, the correct parity bit is determined and stored additionally to the data word in the first parity memory 1204 or the second parity memory 1206, respectively.

Before system power down, the repair information stored in the repair information memory 1209 which can be seen to controlling the repair circuitry (including for example the multiplexer 1210) may be stored into a non-volatile memory 1217.

The non-volatile memory 1217 may be implemented using e-fuses (as for example used during a production test). Alternatively, the repair information may be read from the repair information memory 1209 and stored by the system component 1207 in an internal or external non-volatile system memory which is for example available off-chip or on-chip (e.g. together with user data).

Fusing might be technically more difficult or risky on system level. Further, storing in a non-volatile memory allows saving on-chip area that would be used for the metal fuses.

The system component 1207 may have (system level access) to the repair information for other functionalities such as overruling the repair information to test a memory element 1203 that has previously been found to be corrupted. For example, in case all redundant elements (i.e. all memory elements 1205 of the second memory 1202) are used as backup memory elements of memory elements 1203 of the first memory 1201, the system component 1207 can verify whether the repaired memory collections are really subjected to permanent errors, or e.g. a radioactive particle destroyed the stored information (SER) and caused the error based on which a memory element was found to be corrupted.

For the approach described above with reference to FIG. 12 an existing circuit which is intended for repair during production test can be reused for the in-system repair approach.

It should be noted that a memory test step in combination with a built in repair approach (BISR) may be skipped with the above approach. Scheduling a memory test on system level may be difficult because of the high number of embedded memories. A standard test may also destroy the stored information inside the tested memory and may thus hinder the system to execute correctly. Additionally the environmental conditions of the product containing the memory (especially thermal conditions) could be varying in a way that a one-time executed test could be inefficient.

Based on the information received from the parity bit stored in the parity memory 1204 regarding a defective address a repair mechanism may be reused which is also used in production test.

It should further be noted that the error detection may also be done by software algorithms on system level, either running tests or using ECC information or parity information. System level access to the repair mechanism then allow using this knowledge to directly repair the memory (and thus the product).

In the following, an example is given in which joint error correction information determined based on a plurality of data words, similar to the error correction information stored in the error correction memory 704, is used to detect corrupted memory elements (e.g. memory cells) instead of individual parity bits as in the example described with reference to FIG. 12. This is illustrated in FIG. 13.

Figure 13:
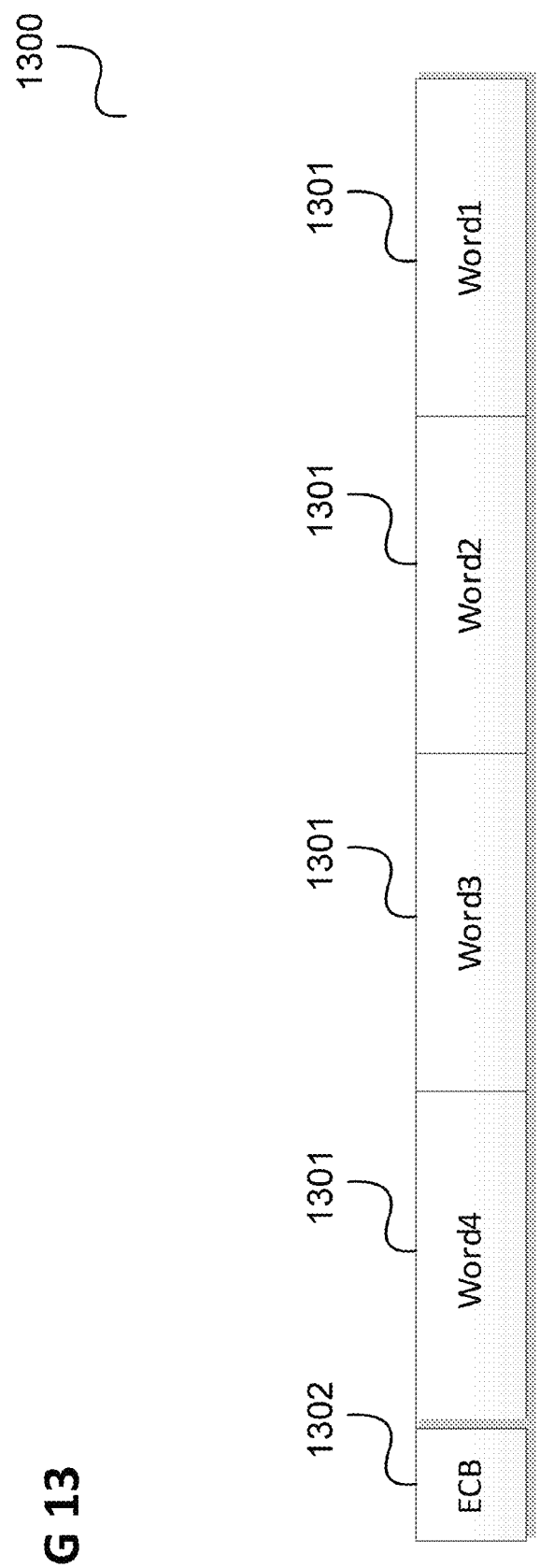
FIG. 13 shows a memory structure illustrating joint error correction/detection information for a plurality of data words.

FIG. 13 shows a memory structure 1300.

In this example, for a plurality of memory elements 1301, each memory element 1301 for example storing one data word, joint error control bits (ECBs) are stored in an ECB memory 1302. In this example, an aggregation level of 5 words is used, i.e. the ECB information, i.e. the error control bits, are determined based on four data words i.e. are common control bits for four data words.

The memory structure 1300 may for example be used for an instruction RAM (IRAM) to detect errors and repair the instruction RAM. This is illustrated in FIG. 14.

Figure 14:
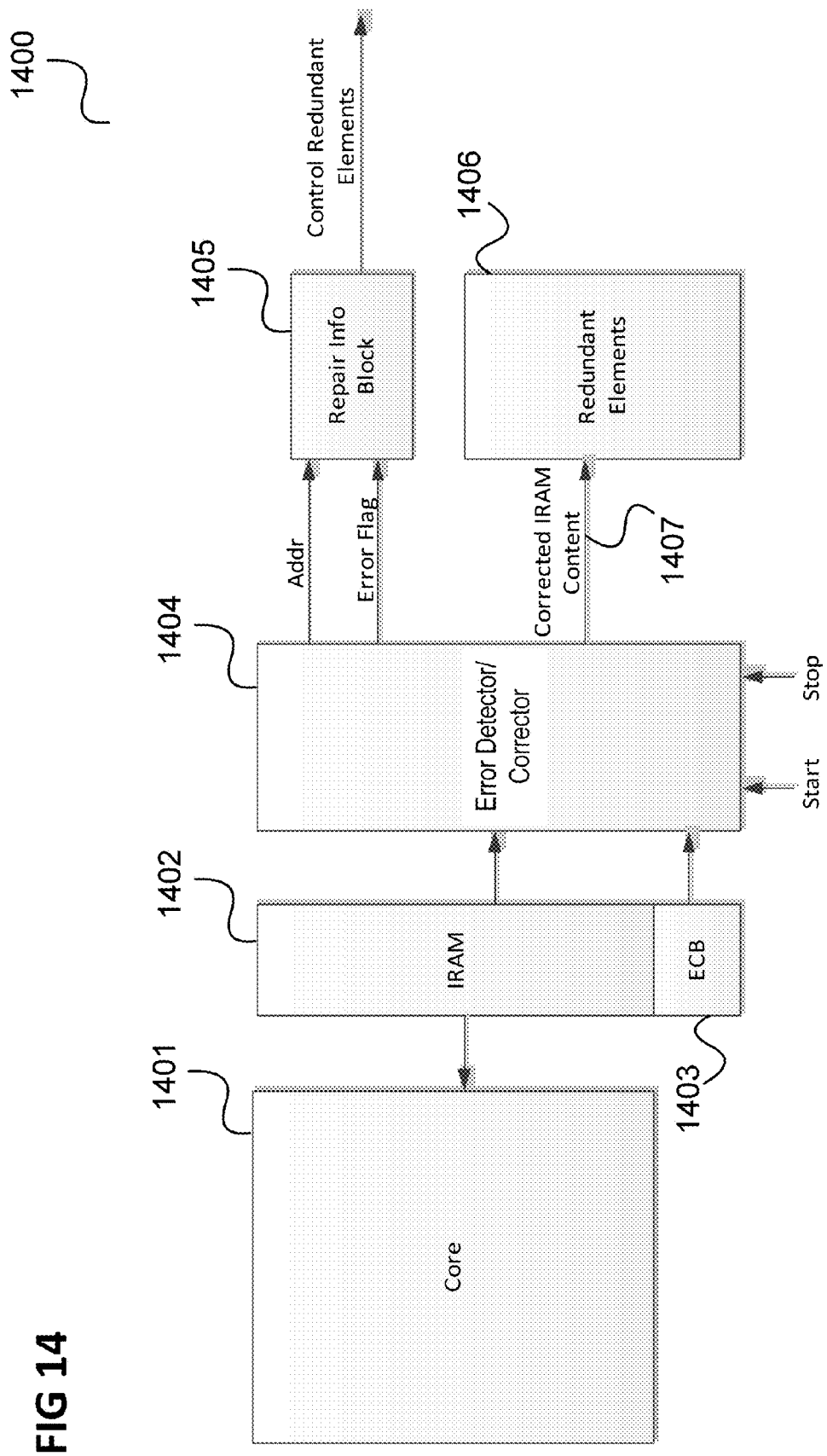
FIG. 14 shows a data processing system configured to repair an instruction memory.

FIG. 14 shows a data processing system 1400.

The data processing system 1400 includes a core 1401 for example corresponding to the core 201 and an instruction RAM 1402 for example corresponding to the instruction RAM 202 of the data processing system 200 illustrated in FIG. 2.

The instruction RAM 1402 (IRAM) includes a plurality of memory elements grouped into sub-groups are provided with an ECB memory 1403 (e.g. an ECB RAM) which holds joint ECB information for each memory element sub group as explained above with reference to FIG. 13. An error detector 1404 has access to the instruction RAM 1402 and the ECB information memory 1403.

To allow the core 1401 to access the IRAM 1402 word wise in a linear fashion without having to load an entire burst, decode it, and then extract the data word of interest, the ECB information may be stored in a separate memory or at least in a dedicated parity area which is normally not accessed by the core 1401.

The core 1401 reads its instructions from the IRAM 1402. Using the IRAM content and the ECB information the error detector 1404 e.g. periodically checks whether all memory elements in the IRAM 1402 work properly by comparing ECB information calculated for stored data words to the ECB information stored in the ECB memory 1403 for these data words. In case an error is detected the error detector 1404 indicates which memory element is erroneous by outputting the address of the memory element and an error flag. Both of these signals are fed to a repair information block. The repair information block 1405 controls the usage of redundant elements 1406 as backup for the memory elements of the IRAM 1402. For example, in case an error is detected for a memory element IRAM 1402 (or an error has been repeatedly detected), the repair information block 1405 controls access to the IRAM 1402 such that content from one of redundant memory elements 1405 is used instead of the memory element of the IRAM 1402.

Figure 15:
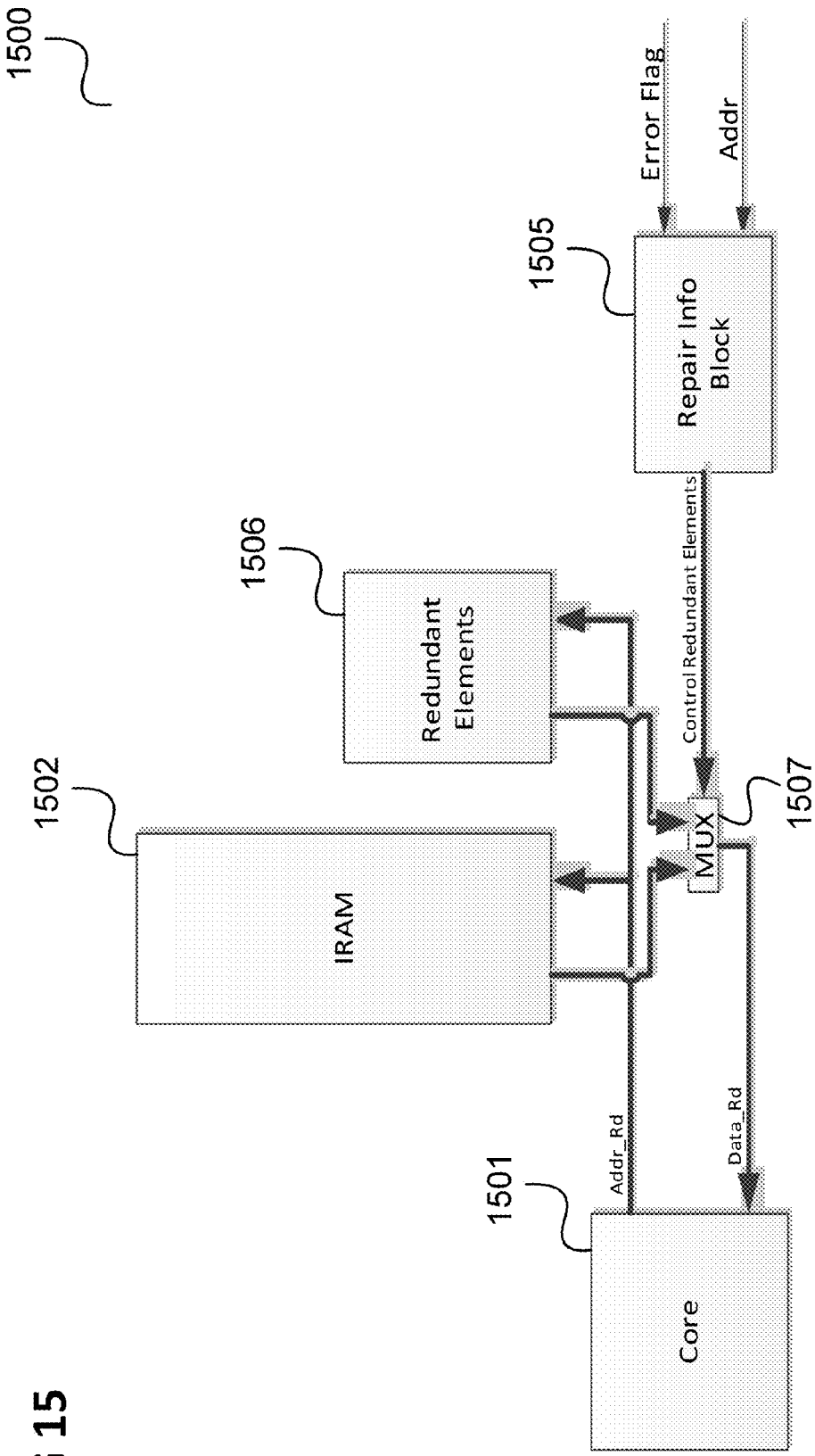
FIG. 15 shows a memory arrangement illustrating repair of an instruction memory using redundant memory elements.

This is illustrated in FIG. 15.

FIG. 15 shows a memory arrangement 1500.

The memory arrangement 1500 includes a core 1501 corresponding to the core 1401, an instruction memory (IRAM) 1502 corresponding to IRAM 1402, redundant memory elements 1506 corresponding to redundant memory elements 1406, a repair information block 1505 corresponding to repair information block 1405 and a multiplexer 1507.

Similar to the approach described with reference to FIG. 12, for a memory element of the IRAM 1502 which has not been found to be corrupt the multiplexer 1507 forwards the data word stored in the memory element to the core in case of a read access. Once the memory element of the IRAM 1502 has been found to be erroneous, however, the repair information block 1505 controls the multiplexer to forward the data word in a memory element of the redundant memory elements 1506, which is assigned the same address as the memory element to which the access is directed, to the core 1501.

The repair information block does this in response to the (for example repeated) detection of an error in a data word stored by the memory element of the IRAM 1502 by the error detector 1404. For example, if the error flag supplied by the error detector 1404 is active for a particular address in the IRAM (e.g. for a certain number of times), the repair information block 1505 then maps an address of an unused redundant memory element to the address of the (presumably) defect memory element of the IRAM 1502 and ensures that the memory element of the IRAM 1502 is not used anymore by a corresponding control of the multiplexer 1507 as explained above.

The error detector (e.g. an error detection circuit) 1404 may have a start and a stop input signal which can be used to start and stop its operation. For example, the error detector 1404 is activated only at certain points in time during normal operation, e.g. after boot of the device including the memory arrangement 1500, in case of an error (e.g. a CPU/DSP exception), during a core dump process, or for example periodically.

This allows reducing the area and power overhead compared to standard and optimized ECC approaches. After detecting an error, on-chip redundancy elements are used to repair the system as explained above, and the repair information (which specifies which memory elements are not to be used) is for example stored by means of electrical fuses or off-chip using a non-volatile memory.

After replacing a defective memory element containing a corrupt data word a corrected version of the data word can be written to the redundant element.

The error detector 1404 is in this example applied to an instruction memory. For an instruction memory, the content is typically already known at compile time and does not change during operation of the device. The corresponding error correction/detection information to be stored in the ECB memory 1404 can thus be calculated off-line and provided during boot-up.

As illustrated in FIG. 13, the error correction/detection information is calculated based on multiple data words, hereby reducing the required storage space (memory information) significantly. For example, the overhead on a 16 bit memory using a 1-bit error correction code is 5 bit (31%). If the control-bits are calculated on 32 words (32×16=512 bits), instead on 1 word, only 10 ECB bits are needed (e.g. if a (522, 512) BCH code is used). Thus, the area overhead is reduced by 94% from 32×5=160 bits to 10 bits. In order to optimize the gate count cyclic codes may be used to calculate the correction bits.

In case the error detection block 1404 is not running permanently during normal operation but for example only activated in certain events as mentioned above, its power consumption for normal reading operations can be neglected such that the power consumption for normal read operations can be seen to be reduced by 100% compared to an approach where a data word is processed by an ECC for each read access. For example, as the underlying cause for memory malfunctions typically is an aging effect a few activations of the error detection block 1404 per day (e.g. checking the whole instruction memory 1402 in each activation) can be expected to be sufficient.

In summary, a repair mechanism for erroneous instruction RAM memory elements (e.g. memory cells) is provided which does not require a significant area and power overhead compared. The mechanism focuses on repairing memory cells that become defective due to an aging process. The proposed mechanism does not attempt to guarantee perfect error-free access to the IRAM 1402 by the core 1401.

The error detector 1404 may rather be scheduled periodically and during boot-up and shut-down procedures to save battery power which detects defective memory cells and is able to correct the corrupted content based on the ECB information. The defective memory cell is then replaced by a redundant memory element which is for example loaded with the corrected word. The area and power savings are achieved by allowing the device to become temporary instable. However, proper operation of the system is ensured after the next reboot of the device is carried out. It is important to note that the aging effects addressed in this document occur with a very small probability. Furthermore, a defective IRAM memory element does not necessarily cause instabilities of the system. The probability that the system becomes instable depends on the scheduling rate of the error detector 1404.

Namely, from the time when a memory element becomes defective until the repair information block 1405 replaces the defective memory cell by a redundant memory element (i.e. the repair information block controls the multiplexer 1507 to forward data from the redundant memory element instead of the defective memory element) the core 1401 might read an erroneous memory content several times, depending on how often a certain command of the IRAM is accessed and the predefined periodicity of the memory check. Depending on the power consumption requirements the memory check can either be scheduled continuously in the background or scheduled only every few seconds or even minutes. Assuming a word width of 16 bit for the IRAM, an aggregation level of 4 (4 words), and a Hamming code the expected overhead is given by 7 bits instead of 20 bits for a standard Hamming code. Increasing the aggregation level reduces the area overhead further.

As reading erroneous instructions from the IRAM 1402 can cause a crash of the core 1401 the error detector 1404 may be configured to check the IRAM 1402 when a crash occurs prior to a system shut-down. Also, prior to a shut-down the repair information available in the repair information block 1405 may be copied to a non-volatile memory section, e.g. external to the chip containing the IRAM 1402). During the next boot procedure the repair information is loaded from the external memory into the repair information block 1405 to ensure that defective memory cells are not used.

As mentioned above the memory check may be scheduled periodically. However, a memory check may in any case be scheduled immediately after booting the device containing the data processing system 1400 and/or in case of a crash of the core 1401.

To enhance the robustness of the system the error detection block 1404 may be replaced by an error correction block which not only detects a defective memory element of the IRAM 1402 storing an erroneous data word but also stores the corrected data word in the redundant memory element replacing the defective memory element. This is illustrated by arrow 1407 symbolizing an access to the redundant elements 1406 by the error detector 1404 (which in this case acts also as an error corrector) in FIG. 14.

For this, the ECB information may include information allowing a correction of corrupt data words (instead of a mere error detection, e.g. by means of a parity bit). Accordingly, compared to the case of error detection without correction, more memory for the ECB information may be required and the complexity of the error detector/corrector may be increased. However, by doing a sequential processing and using for example an aggregation level of 32 the memory overhead due to the ECB information is only $10/(32*16) \approx 2\%$ for a single error correction double error detection code.

Alternatively to the error detector 1404 operating as an error corrector, the core 1401 itself may correct erroneous data words based on the output of the error detector 1404 and the ECB information. This is illustrated in FIG. 16.

Figure 16:
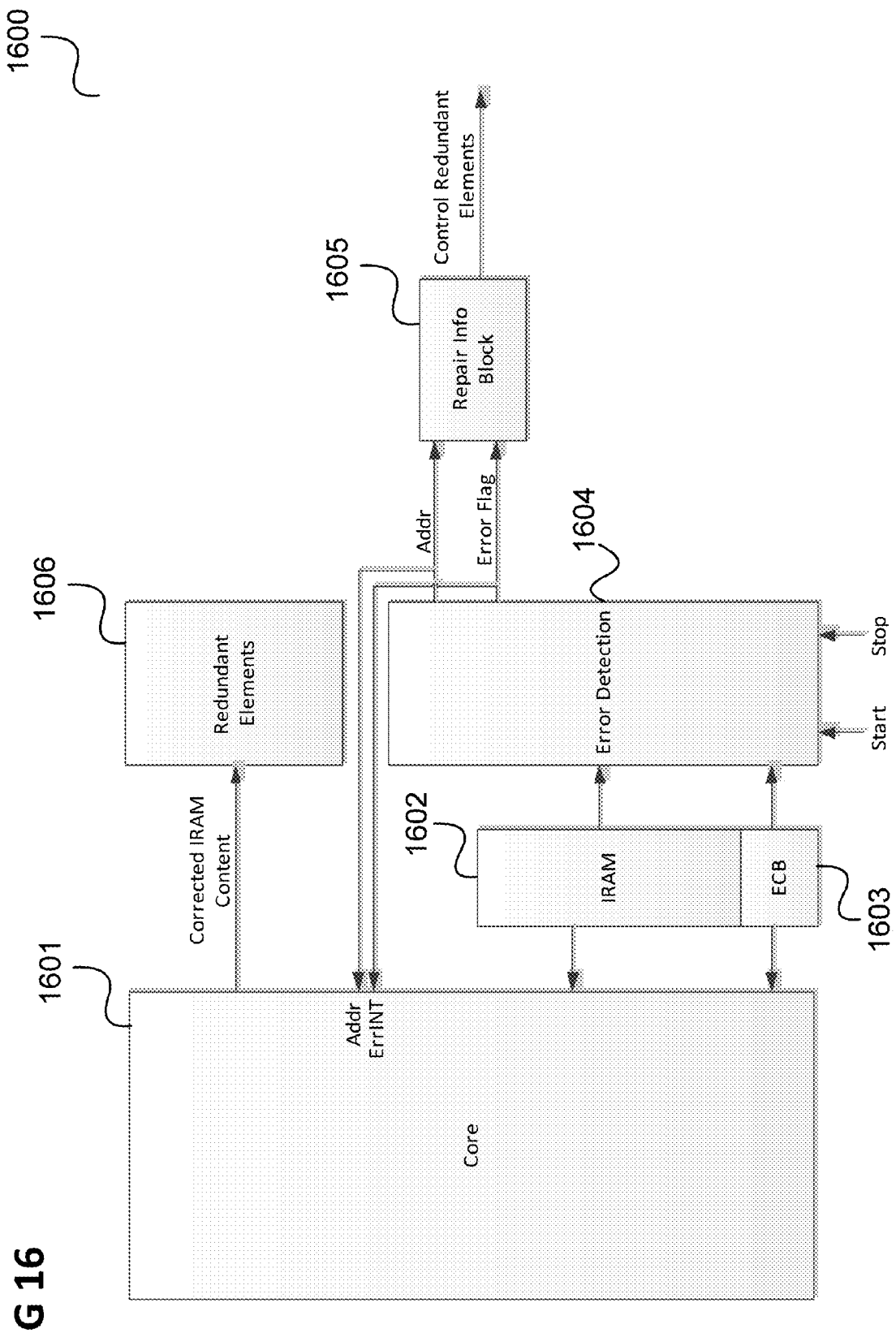
FIG. 16 shows a data processing system including a core configured to correct instruction memory errors.

FIG. 16 shows a data processing system 1600.

Corresponding to the data processing system 1400, the data processing system 1600 includes a core 1601, an IRAM 1602, an ECB information memory 1603, an error detector 1604, a repair information block 1605 and redundant elements 1606 operating as described above with reference to FIGS. 14 and 15.

However, in this example, the error flag output by the error detector 1604 is mapped to an error interrupt (ErrINT) of the core 1601. In case the core 1601 receives an ErrINT interrupt an interrupt service routine is called which reads the corrupted data word, the core reads 1601 the ECB information for the corrupted data word and the data words based on which the ECB information has been determined besides the corrupted data word (according to the aggregation illustrated in FIG. 13) from IRAM 1602 and the ECB information memory 1603 and corrects the corrupted data word and writes the corrected data word to the redundant memory element assigned for the memory element holding the corrupt data word. The control of the redundant elements may still be done as explained with reference to FIG. 15.

The joint ECB information for a plurality of data words may for example be a codeword generated according to a cyclic code. A cyclic code may typically be implemented efficiently with small area overhead.

It should be noted that the error detector 1404 may be implemented using software, e.g. by a program running on the core, such that the core 1401 itself reads data words and ECB information from the IRAM 1402. For this, a corresponding suitable interface between the core 1401 and the IRAM 1402 may be provided. Further, a corresponding suitable interface between the core 1401 and the repair information block 1405 may be provided.

For the above examples, no real-time decoding and correction of the content of the IRAM 1402 is required, which would require high complexity. Also, depending on the system requirements performing error detection on the redundant elements 1406 may or may not be performed. For example, in case a certain probability of memory error is acceptable performing error detection on the redundant elements may be omitted and error detection may for example only be performed on memory blocks of large size.

It should further be noted that memory or chip production tests, for example carried out at the factory, may still be carried out in addition.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A memory circuit comprising
   a plurality of memory elements, wherein each memory element is configured to store one data element of a plurality of data elements;
   an error correction information memory configured to store joint error correction information of the plurality of data elements, wherein the joint error correction information is based on all data elements of the plurality of data elements;

for each memory element, an error detection information memory to store error detection information for the data element stored in the memory element, wherein the error detection information for each data element is independent from data elements stored in the remaining memory elements of the plurality of memory elements; and a memory access circuit configured to, for a read access to a memory element of the plurality of memory elements, check whether the error detection information for the data element stored in the memory element indicates an error of a current data element currently stored in the memory element and, if, and only if, the memory element indicates an error of the current data element currently stored in the memory element, to access the remaining memory elements to read the remaining data elements of the plurality of data elements stored in respective ones of the remaining memory elements and to process the current data element and the remaining data elements stored in the remaining memory elements based on the joint error correction information of the plurality of data elements for correction of the error in the current data element.

2. Memory circuit according to claim 1, wherein the memory access circuit is configured to omit accessing the remaining memory elements and processing the current data element and the data elements stored in the remaining memory elements based on the joint error correction information of the plurality of data elements for correcting the error in the current data element if the error detection information for the current data element currently stored in the memory element does not indicate an error of the current data element currently stored in the memory element.

3. Memory circuit according to claim 1, wherein the error detection information comprises one or more parity bits.

4. Memory circuit according to claim 1, wherein to process the current data element and the data elements stored in the remaining memory elements based on the joint error correction information, the memory access circuit is to store the corrected data element in the memory element.

5. A method for accessing a memory comprising:
storing a plurality of data elements;
storing joint error correction information of the plurality of data elements, wherein the joint error correction information is based on all data elements of the plurality of data elements;
storing error detection information for each data element, wherein the error detection information for each data element is independent from data elements stored in the remaining memory elements of the plurality of memory elements;
checking, for a read access to a currently stored data element of the plurality of data elements, whether the error detection information for the data element indicates an error of currently stored data element and
if, and only if, the error detection information for the currently stored data element indicates an error of the currently stored data element, accessing the remaining memory elements to read the remaining data elements of the plurality of data elements currently stored in respective ones of the remaining memory elements and processing the currently stored data element and the remaining data elements stored in the remaining memory elements based on the joint error correction information of the plurality of data elements for correcting the error in the current data element.

6. A memory circuit comprising:
a plurality of memory elements, wherein each memory element is configured to store one data element of a plurality of data elements;
an error correction information memory configured to store joint error correction information of the plurality of data elements, wherein the joint error correction information is based on all data elements of the plurality of data elements;
for each memory element, an error detection information memory to store error detection information for the data element stored in the memory element, wherein the error detection information for each data element is independent from data elements stored in the remaining memory elements of the plurality of memory elements;
a memory access circuit configured to, for a write access for writing a new data element to the memory element of the plurality of memory elements, check whether the error detection information for the data element stored in the memory element indicates an error of the current data element currently stored in the memory element and, if, and only if the memory element indicates an error of the current data element currently stored in the memory element, to access the remaining memory elements to read the remaining data elements of the plurality of data elements stored in respective ones of the remaining memory elements and to process the new data element and the remaining data elements stored in the remaining memory elements to update the joint error correction information of the plurality of data elements.

7. Memory circuit according to claim 6, wherein the memory access circuit is configured to omit accessing the remaining memory elements and processing the new data element and the data elements stored in the remaining memory elements to update the joint error correction information of the plurality of data elements if the error detection information for the current data element currently stored in the memory element does not indicate an error of the current data element currently stored in the memory element.

8. Memory circuit according to claim 6, wherein processing the new data element and the data elements stored in the remaining memory elements to update the joint error correction information of the plurality of data elements comprises storing the updated joint correction information in the error correction information memory.

9. The memory circuit according to claim 6, wherein the error detection information comprises one or more parity bits.

10. A method for accessing a memory:
storing a plurality of data elements;
storing joint error correction information of the plurality of data elements, wherein the joint error correction information is based on all data elements of the plurality of data elements;
storing error detection information for each data element, wherein the error detection information for each data element is independent from data elements stored in the remaining memory elements of the plurality of memory elements;
checking, for a write access for writing a new data element to the memory element of the plurality of memory elements, whether the error detection information for the data element stored in the memory element indicates an error of the current data element currently stored in the memory element and if, and only if, the memory element indicates an error of the current data element currently stored in the memory element, accessing the remaining memory elements to read the remaining data elements of the plurality of data elements stored in respective ones of the remaining memory elements and processing the new data element and the remaining data elements stored in the remaining memory elements to update the joint error correction information of the plurality of data elements.

* * * * *